(12) United States Patent
Pyo

(10) Patent No.: US 9,620,191 B2
(45) Date of Patent: Apr. 11, 2017

(54) MEMORY DEVICE AND MEMORY SYSTEM INCLUDING THE SAME

(71) Applicant: Samsung Electronics Co., Ltd., Suwon-si (KR)

(72) Inventor: Suk-Soo Pyo, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/068,580

(22) Filed: Mar. 12, 2016

(65) Prior Publication Data

US 2016/0343421 A1   Nov. 24, 2016

(30) Foreign Application Priority Data

May 18, 2015   (KR) .................. 10-2015-0068655

(51) Int. Cl.
*G11C 11/16* (2006.01)
*G11C 11/15* (2006.01)

(52) U.S. Cl.
CPC .......... *G11C 11/1673* (2013.01); *G11C 11/15* (2013.01); *G11C 11/16* (2013.01)

(58) Field of Classification Search
CPC ...... G11C 11/16; G11C 11/15; G11C 11/1673
USPC ....................................................... 365/158
See application file for complete search history.

(56) References Cited

U.S. PATENT DOCUMENTS

| | | |
|---|---|---|
| 6,331,943 B1 | 12/2001 | Naji et al. |
| 6,590,804 B1 | 7/2003 | Perner |
| 7,813,166 B2 | 10/2010 | Jung et al. |
| 8,400,824 B2 | 3/2013 | Rho |
| 8,593,173 B2 | 11/2013 | Kim et al. |
| 8,665,638 B2 | 3/2014 | Rao et al. |
| 8,693,240 B1 | 4/2014 | Abedifard et al. |
| 8,902,641 B2 | 12/2014 | Chih et al. |
| 2013/0265820 A1* | 10/2013 | Chih ................... G11C 11/1673 365/158 |
| 2013/0314949 A1 | 11/2013 | Chi et al. |

(Continued)

FOREIGN PATENT DOCUMENTS

| | | |
|---|---|---|
| JP | 2012-243364 A | 12/2012 |
| KR | 10-2012-0072550 A | 7/2012 |

(Continued)

*Primary Examiner* — Han Yang
*Assistant Examiner* — Xiaochun L Chen
(74) *Attorney, Agent, or Firm* — Muir Patent Law, PLLC

(57) ABSTRACT

A memory device may include a data region, a reference region, a resistor circuit, and a sense amplifier. The data region may include a plurality of data memory cells coupled between a first bit line and a first source line. The data region may provide a data voltage corresponding to data stored in each of the data memory cells. The reference region may include a plurality of reference memory cells coupled between a reference bit line and a reference source line. The reference region may provide a reference voltage. The resistor circuit may include one or more resistors, and is coupled between the reference source line and a power source line. The sense amplifier may provide an output voltage by comparing the data voltage and the reference voltage. The power source line may be either a ground voltage or a negative voltage.

20 Claims, 35 Drawing Sheets

(56) References Cited

U.S. PATENT DOCUMENTS

2016/0071582 A1* 3/2016 Chung ............... G11C 11/1675
                                                                       365/96

FOREIGN PATENT DOCUMENTS

| KR | 10-2012-0091583 A | 8/2012 |
| KR | 10-2013-0132177 A | 12/2013 |

\* cited by examiner

MEMORY DEVICE AND MEMORY SYSTEM INCLUDING THE SAME

CROSS-REFERENCE TO RELATED APPLICATION

This application claims priority under 35 USC §119 to Korean Patent Applications No. 10-2015-0068655, filed on May 18, 2015 in the Korean Intellectual Property Office (KIPO), the contents of which are herein incorporated by reference in their entirety.

BACKGROUND

1. Technical Field

Example embodiments relate generally to semiconductor devices and more particularly to a memory device and a memory system including the memory device.

2. Description of the Related Art

In general, a magneto-resistive memory (MRAM) device may access data by using reference cells including spin transfer torque-magneto-resistive random access memory (STT-MRAM) cells. Recently, research has been developed for optimizing an MRAM device for secured reading data from reference cells of the MRAM.

SUMMARY

Some example embodiments provide a memory device capable of increasing performance by providing a reference voltage based on a resistance value of a resistor circuit that is connected to a reference source line.

Some example embodiments provide a memory cell array capable of increasing the performance by providing the reference voltage based on the resistance value of the resistor circuit that is connected to the reference source line.

Some example embodiments provide a memory system capable of increasing the performance by providing the reference voltage based on the resistance value of the resistor circuit that is connected to the reference source line.

According to example embodiments, an electronic device includes a memory device including a memory cell array and a sense amplifier. The memory cell array includes a data region, a reference region and a resistor circuit. The data region includes a plurality of data memory cells coupled between a first bit line and a first source line. The data region provides a data voltage corresponding to data stored in each of the data memory cells. The reference region includes a plurality of reference memory cells coupled between a reference bit line and a reference source line. The reference region provides a reference voltage. The resistor circuit includes one or more resistors, and is coupled between the reference source line and a power source line. The sense amplifier provides an output voltage by comparing the data voltage and the reference voltage. The power source line is either a ground voltage VSS or a negative voltage RV.

A state of each of the reference memory cells may be a first state where a spin direction of a first layer included in the reference memory cell is equal to a spin direction of a second layer included in the reference memory cell.

The reference region may include a reference transistor connecting between the reference source line and the resistor circuit. The data region may include a data transistor connecting between the first source line and a ground voltage.

The reference transistor and the data transistor may be turned on based on a read signal.

The resistor circuit may be connected between the reference transistor and the ground voltage.

A voltage of the reference bit line may be changed based on the resistance value of the resistor circuit.

The voltage of the reference bit line may be increased as the resistance value of the resistor circuit is increased.

The voltage of the reference bit line may be decreased as the resistance value of the resistor circuit is decreased.

The reference transistor may be a NMOS transistor

The memory device may control the resistance value of the resistor circuit based on a resistor control signal.

When the resistor control signal is a first logic level, the resistance value of the resistor circuit may be increased.

When the resistor control signal is a second logic level, the resistance value of the resistor circuit may be decreased.

A reference minimum voltage may be greater than first data maximum voltage. The reference minimum voltage may be a minimum value in a voltage distribution of the reference memory cells. The first data maximum voltage may be a maximum value in a voltage distribution of first data voltage memory cells that have the first data among the data memory cells.

A reference maximum voltage may be less than a second data minimum voltage. The reference maximum voltage may be a maximum value in a voltage distribution of the reference memory cells. The second data minimum voltage may be a minimum value in a voltage distribution of second data voltage memory cells that have second data among the data memory cells.

A state of each of the reference memory cells may be a second state where a spin direction of a first layer included in the reference memory cell is different from a spin direction of a second layer included in the reference memory cell.

The reference region may include a reference transistor connecting between the reference source line and the resistor circuit. The reference transistor may be turned on based on a read signal.

The resistor circuit may be connected between the reference transistor and a reverse bias voltage.

A voltage of the reference bit line may be controlled according to the reverse bias voltage.

The memory cell array may be a three-dimensional memory cell array.

A memory cell of the memory cell array may include a magnetic tunnel junction element.

According to example embodiments a memory system includes a memory controller and a memory device. The memory controller provides an access address signal and a read signal. The memory device provides an output data based on the access address signal and the read signal. The memory device includes a data region, a reference region and a sense amplifier. The data region provides a data voltage corresponding to data stored in data memory cells. The data region includes the data memory cells that are disposed between bit lines and source lines. The reference region provides a reference voltage based on a resistance value of a resistor circuit that is connected to a reference source line. The reference region includes reference memory cells that are disposed between a reference bit line and the reference source line. The sense amplifier provides the output data by comparing the data voltage and the reference voltage.

The memory device according to example embodiments may increase the performance by providing the reference voltage based on the resistance of the resistor circuit that is connected to the reference source line.

According to example embodiments, a memory device includes a first memory cell coupled between a first bit line and a first source line, a first transistor coupled between the first source line and a first power source line, a second memory cell coupled between a second bit line and a second source line, a second transistor coupled between the second source line and a second power source line, a resistor circuit including one or more resistors coupled between the second transistor and the second power source line, and a sense amplifier configured to sense and amplify a voltage difference between a voltage level of the first bit line and a voltage level of the second bit line. The voltage level of the second bit line is variable based on a resistance value of the resistor circuit.

According to example embodiments, a memory device includes a first set of memory cells coupled between a first bit line and a first source line, wherein each cell of the first set of memory cells includes a first magnetic tunnel junction element and a first cell transistor connected to each other, a second set of memory cells coupled between a second bit line and a second source line, wherein each cell of the second set of memory cells includes a second magnetic tunnel junction element and a second cell transistor connected to each other, a resistor circuit including one or more resistors, and coupled between the second source line and a power source line, and a sense amplifier configured to provide an output voltage based on a voltage level of the first bit line and a voltage level of the second bit line. The voltage level of the second bit line is variable based on the resistance value of the resistor circuit.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
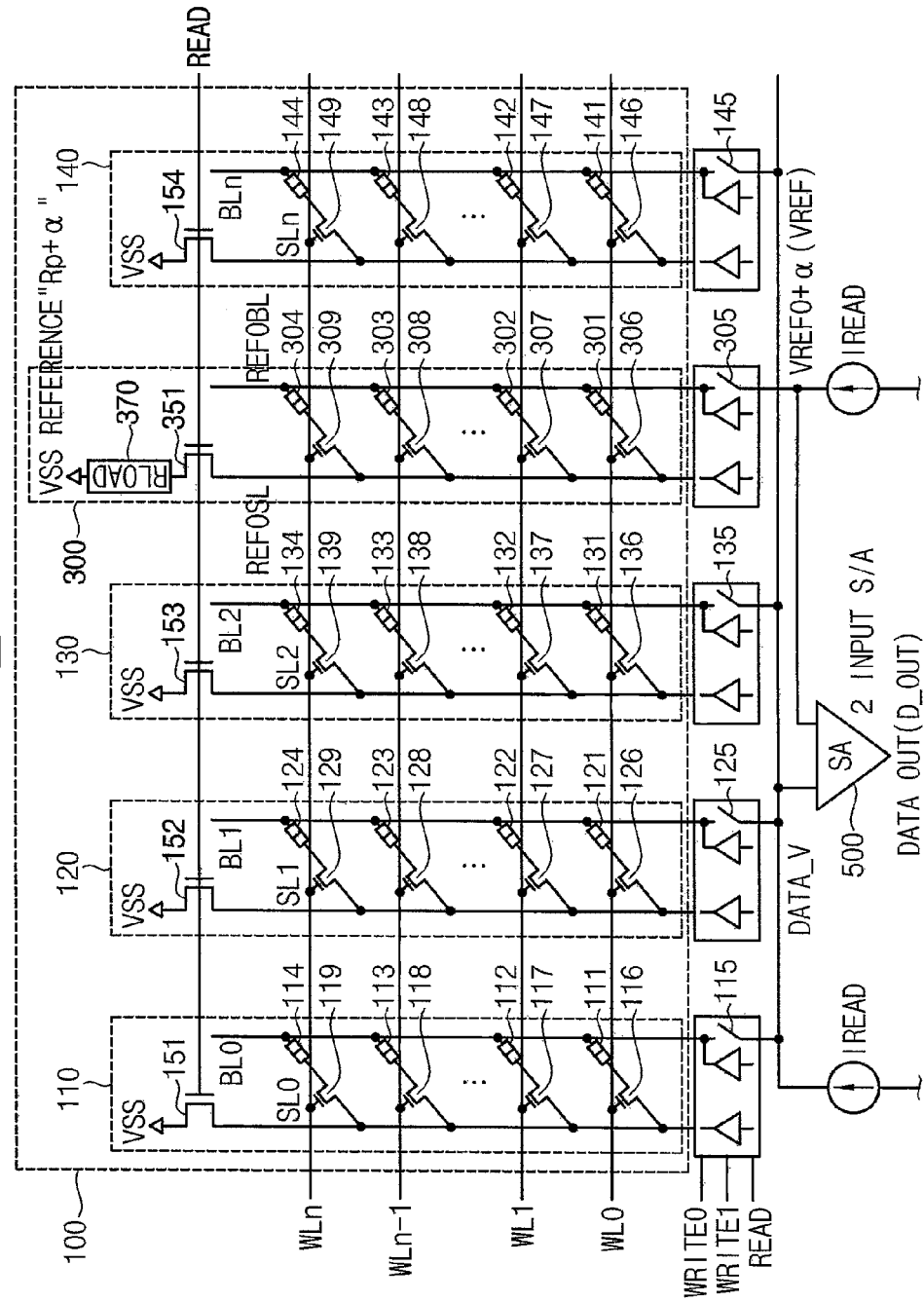
FIG. 1 is a diagram illustrating a memory device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another elements, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory device according to example embodiments. A memory device as described herein may be a type of semiconductor device or electronic device. As used herein, a magneto-resistive random access memory (MRAM) may refer to various items such as a memory device, one or more logic devices or memory cells formed in or on a semiconductor substrate, a semiconductor chip, a memory chip, a memory die, a package including one or memory chips and optionally one or more logic chips, or combinations thereof. A magneto-resistive random access memory (MRAM) such as a semiconductor chip, a memory chip, or a logic chip may be formed from a wafer. A magneto-resistive random access memory (MRAM) may comprise a package which may include one or more chips stacked on a package substrate, or a package-on-package device including a plurality of packages. A magneto-resistive random access memory (MRAM) may include one or more transistors such as metal oxide semiconductor field effect transistors (MOSFETs) or fin field effect transistors (FinFETs), or an array of memory cells.

An electronic device, as used herein, may refer to one of these devices and may also include products that include these devices, such as a memory card, a memory module, a hard drive including additional components, a mobile phone, laptop, tablet, desktop, camera, server, or other consumer electronic device.

Referring to FIG. 1, a memory device 10 includes a memory cell array 100 and a sense amplifier 500. The memory cell array 100 includes data regions 110, 120, 130, and 140 and a reference region 300. Each of the data regions 110, 120, 130, and 140 provides a data voltage DATA_V corresponding to data stored in data memory cells. Each of the data regions 110, 120, 130, and 140 may include a plurality of data memory cells. The plurality of data memory cells may include data memory cell elements 111 to 114, 121 to 124, 131 to 134, and 141 to 144 (e.g., magnetic tunnel junction (MTJ) elements) and data cell transistors 116 to 119, 126 to 129, 136 to 139, and 146 to 149 that are disposed between bit lines BL0, BL1, BL2, and BLn and source lines SL0, SL1, SL2, and SLn, respectively. For example, according to certain embodiments, a data memory cell includes a data memory cell element (e.g., a magnetic tunnel junction (MTJ) element) and a data cell transistor connected to each other. For example, the data regions 110, 120, 130, and 140 may include a first data region 110, a second data region 120, a third data region 130 and a fourth data region 140. The first data region 110 may include the first to fourth data memory cell elements 111 to 114 and data cell transistors 116 to 119 that are disposed between a first bit line BL0 and a first source line SL0. The second data region 120 may include a fifth to eighth data memory cell elements 121 to 124 and data cell transistors 126 to 129 that are disposed between a second bit line BL1 and a second source line SL1. The third data region 130 may include a ninth to twelfth data memory cell elements 131 to 134 and data cell transistors 136 to 139 that are disposed between a third bit line BL2 and a third source line SL2. The fourth data region 140 may include a thirteenth to sixteenth data memory cell elements 141 to 144 and data cell transistors 146 to 149 that are disposed between a fourth bit line BLn and a fourth source line SLn.

The reference region 300 may include a plurality of reference memory cells. The plurality of reference memory cells may include reference cell elements 301, 302, 303, and 304 (e.g., magnetic tunnel junction (MTJ) elements) and reference cell transistors 306, 307, 308, and 309 that are disposed between a reference bit line REF0BL and a reference source line REF0SL. For example, each reference memory cell may include a reference cell element (e.g., a magnetic tunnel junction (MTJ) element) and a reference cell transistor connected to each other. As will be described in FIG. 14, the state of each of the first to fourth reference memory cell elements 301 to 304 may be a first state where a spin direction of a first layer 361 included in each of the first to fourth reference memory cell elements 301 to 304 is equal to a spin direction of a second layer 362 included in each of the first to fourth reference memory cell elements 301 to 304. For example, the first state disclosed herein, may correspond to a low resistance. For example, the spin direction of the first layer 361 and the second layer 362 included in each of the first to fourth reference memory cell elements 301 to 304 may be a first direction D1.

The reference region 300 provides a reference voltage VREF based on a resistance value of a resistor circuit 370 that is connected between the reference source line REF0SL and a ground voltage line VSS (hereinafter, which may be referred to as a ground voltage). The reference voltage VREF may be more stable when the resistor circuit 370 is connected to the reference source line REF0SL compared to connected to the reference bit line REF0BL. For example, a third word line WLn-1 may be enabled to read the data of a third data memory cell element 113 included in the first data region 110.

In example embodiments, a data switch 115 for the first data region 110 may be turned on based on a read signal READ. For example, the read signal READ may activate when the memory device 10 is in a read operation and inactivate when the memory device 10 is in a write operation. When the data switch 115 for the first data region 110 is turned on based on the read signal READ, a read current IREAD may be provided to the first data region 110 along the first bit line BL0. When the third word line WLn-1 is enabled and the read current IREAD is provided to the first data region 110 along the first bit line BL0, the read current IREAD may be provided to the first source line SL0 through the third data memory cell element 113 and the third data cell transistor 118. When the read current IREAD is provided to the first source line SL0 through the third data memory cell element 113 and the third data cell transistor 118, the read current IREAD may be provided to the ground voltage VSS through a data transistor 151 of the first data region 110. For example, the voltage of the first bit line BL0 may be the data voltage DATA_V.

In example embodiments, in the reference region 300, a reference switch 305 may be turned on based on the read signal READ. When the reference switch 305 is turned on based on the read signal READ, the read current IREAD may be provided to the reference region 300 along the reference bit line REF0BL. When the third word line WLn-1 is enabled and the read current IREAD is provided to the reference region 300 along the reference bit line REF0BL, the read current IREAD may be provided to the reference source line REF0SL through the third reference memory cell element 303 and the third reference cell transistor 308. When the read current IREAD is provided to the reference source line REF0SL through the third reference memory cell element 303 and the third reference cell transistor 308, the read current IREAD may be provided to the ground voltage VSS through a reference transistor 351 and the resistor circuit 370. For example, the voltage of the reference bit line REF0BL may be the reference voltage VREF.

In certain embodiments, when the resistance value of the resistor circuit 370 is 0, the reference voltage VREF that is provided from the reference region 300 may be a reference voltage VREF corresponding to data '0'. The reference voltage VREF that is provided from the reference region 300 may be increased as the resistance of the resistor circuit 370 is increased. In addition, the reference voltage VREF that is provided from the reference region 300 may be decreased as the resistance value of the resistor circuit 370 is decreased. Therefore, when the resistance of the resistor circuit 370 is controlled, the reference voltage VREF that is provided from the reference region 300 may be used to determine whether the data voltage DATA_V from each of the data regions 110, 120, 130, and 140 is a voltage corresponding to data '0' or a voltage corresponding to data '1'.

The sense amplifier 500 provides an output data D_OUT by comparing the data voltage DATA_V and the reference voltage VREF. For example, the data that is stored in the third data memory cell element 113 included in the first data region 110 may be '1'. The third word line WLn-1 may be enabled to read the data of the third data memory cell element 113 included in the first data region 110. When the third word line WLn-1 is enabled and the read current IREAD is provided to the reference region 300 along the reference bit line REF0BL, the reference region 300 may provide the reference voltage VREF. In addition, when the third word line WLn-1 is enabled and the read current IREAD is provided to the first data region 110 along the first bit line BL0, the first data region 110 may provide the data voltage DATA_V corresponding to data '1'. For example, the sense amplifier 500 may provide the output data D_OUT by comparing the data voltage DATA_V corresponding to data '1' and the reference voltage VREF.

The memory device 10 according to example embodiments may increase the performance by providing the reference voltage VREF based on the resistance value of the resistor circuit 370 that is coupled between the reference source line REF0SL and the ground voltage VSS.

Figure 2:
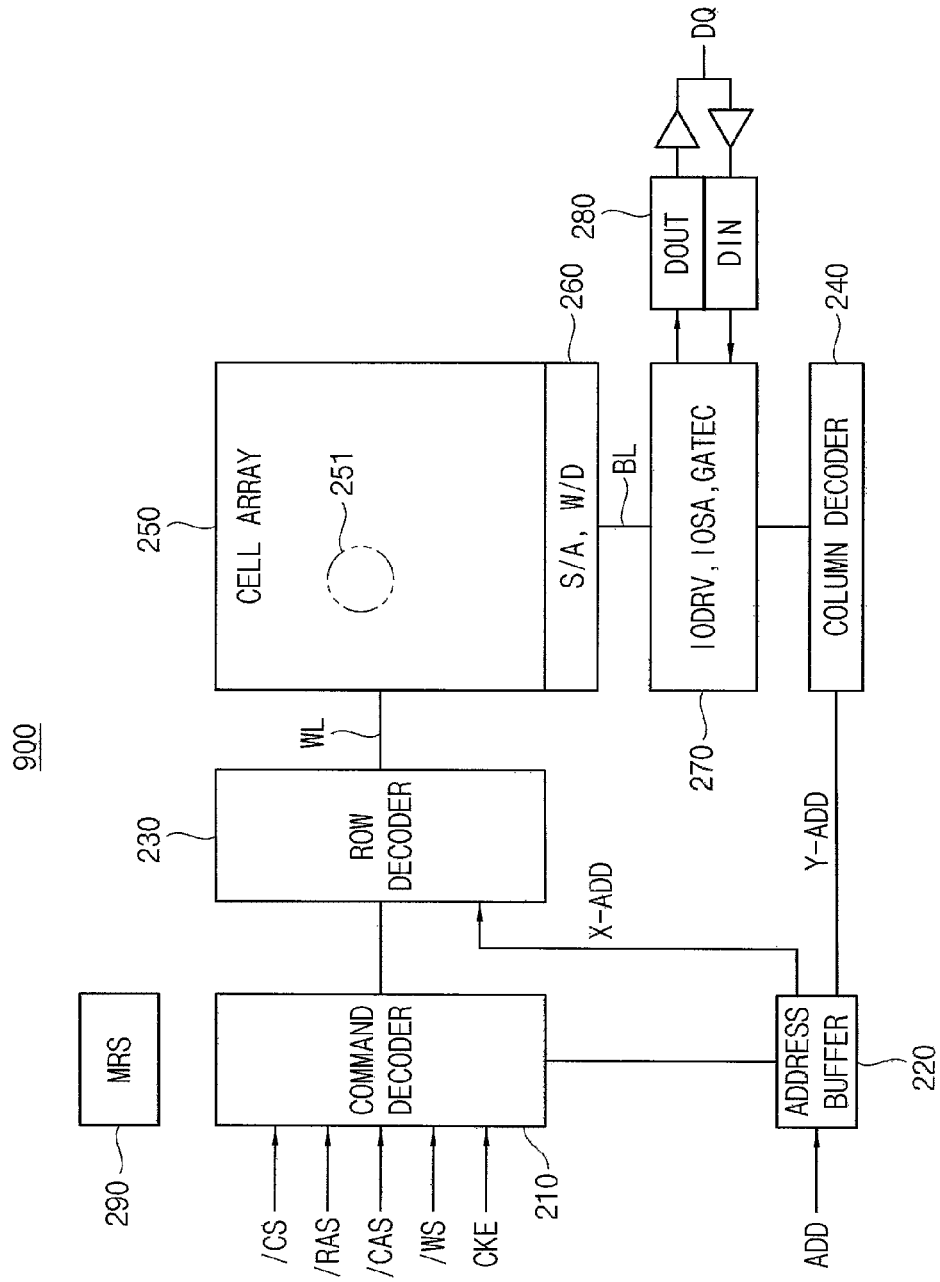
FIG. 2 is a block diagram illustrating a memory device according to example embodiments.

FIG. 2 is a block diagram illustrating a memory device according to example embodiments.

Referring to FIG. 2, a semiconductor memory device 900 may include a command decoder 210, an address buffer 220, a row decoder 230, a column decoder 240, a memory cell array 250, a sense-amplifier/write-driver (S/A, W/D) unit 260 (as used herein, a "unit" may refer to a "circuit"), an input-output driver unit 270, a data input-output unit 280 and a mode register set 290.

The mode register set 290 may set the semiconductor memory device 900 in a normal operation mode or in a test mode. The test mode may be one of the read leveling test mode, the parallel bit test mode and the boundary scan test mode.

The command decoder 210 receives a command CMD from an external device such as the memory controller and performs a decoding operation on the received command. The command decoder 210 may perform the decoding operation based on a chip select signal /CS, a row address strobe signal /RAS, a column address strobe signal CAS/, a write enable signal /WE and a clock enable signal CKE. After the decoding operation is completed, the memory device 900 may be controlled to perform the command CMD from the memory controller.

The address signal ADD from the memory controller is stored in the address buffer 220. The address buffer 220 provides a row address X-ADD to the row decoder and a column address Y-ADD to the column decoder 240.

The row decoder 230 and the column decoder 240 include a plurality of switches, respectively. The row decoder 230 performs a switching operation in response to the row address X-ADD to select a wordline WL and the column decoder 240 performs a switching operation in response to the column address Y-ADD to select a bitline BL. The memory cell array 250 includes a plurality of memory cells. The memory cell 251, which is disposed in the cross area of the wordline WL and the bitline BL, may be selected to write or read data.

The memory cell 251 may be an STT-MRAM cell. The STT-MRAM cell 251 has characteristics of non-volatility and has a relatively small or great resistance value depending on the written data.

In a read operation, a data voltage corresponding to the resistance value of the memory cell 251 is provided to the sense-amplifier/write-driver unit 260. The sense-amplifier/write-driver unit 260 includes a plurality of sense amplifier circuits for sensing and amplifying the data voltage to output a digital signal corresponding to the data voltage. The signals from the sense-amplifier/write-driver unit 260 are transferred to the data input-output unit 280 via the input-output driver unit 270. The input-output driver unit 270 may include an input-output driver IODRV, an input-output sense amplifier IOSA and a gating circuit GATEC. The data input-output unit 280 may include an output buffer DOUT and an input buffer DIN. The data input-output unit 280 output the transferred data DQ to the memory controller.

Figure 3:
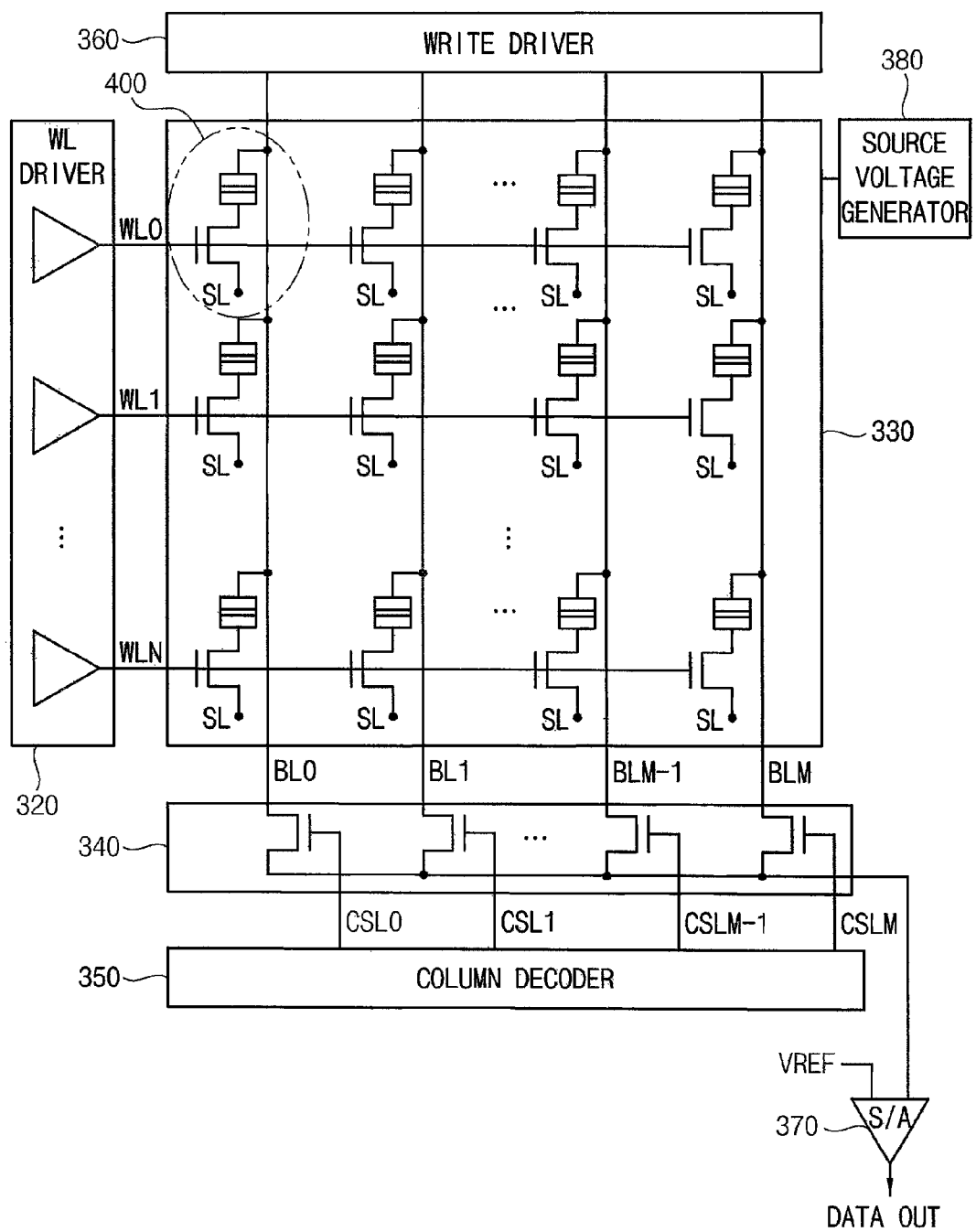
FIG. 3 is a circuit diagram illustrating an example of a memory cell array in the memory device of FIG. 2 according to example embodiments.

FIG. 3 is a circuit diagram illustrating an example of a memory cell array in the memory device of FIG. 2 according to example embodiments.

Referring to FIG. 3, a memory cell array 330 includes a plurality of wordlines WL0~WLN, a plurality of bitlines BL0~BLM and a plurality of memory cells 400 respectively disposed in cross areas of the wordlines WL0~WLN and the bitlines BL0~BLM. When the memory cell 400 is implemented with an STT-MRAM cell, each memory cell 400 may include a magnetic tunnel junction (MTJ) element of magnetic materials. The memory cell 400 of the memory cell array 330 may include the magnetic tunnel junction element.

The memory cell 400 may include a cell transistor and the MTJ element. The cell transistor is turned on or off in response to a signal driven by a wordline driver 320. The wordline driver 320 outputs wordline voltages to select one of the wordlines WL0~WLN. The wordline driver 320 may include a means for decoding the row address, or the decoded address may be provided to the wordline driver 320 from the row decoder 230 in FIG. 2. The cell transistor and the MTJ element in each memory cell 400 are coupled between a source line SL and one of the bitlines BL0~BLM. Even though not illustrated in FIG. 3, a plurality of memory cells may be coupled to the common source line. In some embodiments, the memory cell array 330 may be partitioned to at least two cell regions and the cell regions may be coupled to the different source lines.

In some example embodiments, the MTJ element may be replaced with, for example, phase-change random access memory (PRAM) using phase-change materials, resistance random access memory (RRAM) using complex metal oxide of variable resistance, ferroelectrics random access memory (FRAM) using ferroelectric materials and magneto-resistive random access memory (MRAM) using ferromagnetic materials. Such resistive memories have the resistance value depending on the magnitude and/or the direction of the applied current or voltage and have characteristics of non-volatility of maintaining the resistance value even though power is off.

The bitlines BL0~BLM are coupled to a write driver 360. The write driver 360 may perform a write operation by applying currents or voltages to the memory cells in response to an external command.

The column decoder 350 generates column select signals CSL0~CSLM to select one of the bitlines BL0~BLM. For example, a switching unit 340 including switches coupled to the bitlines BL0~BLM may be implemented and the column select signals CSL0~CSLM may be provided to the switching unit 340. In the read operation, the data voltage depending on the resistance value of the memory cell 400 is transferred to the sense amplifier 370 via the corresponding bitline. The sense amplifier 370 senses and amplifies the difference between the data voltage and a reference voltage to output a digital signal. The source voltage generator 380 is coupled to the source line SL and provides voltages for the read operation or the write operation.

Figure 4:
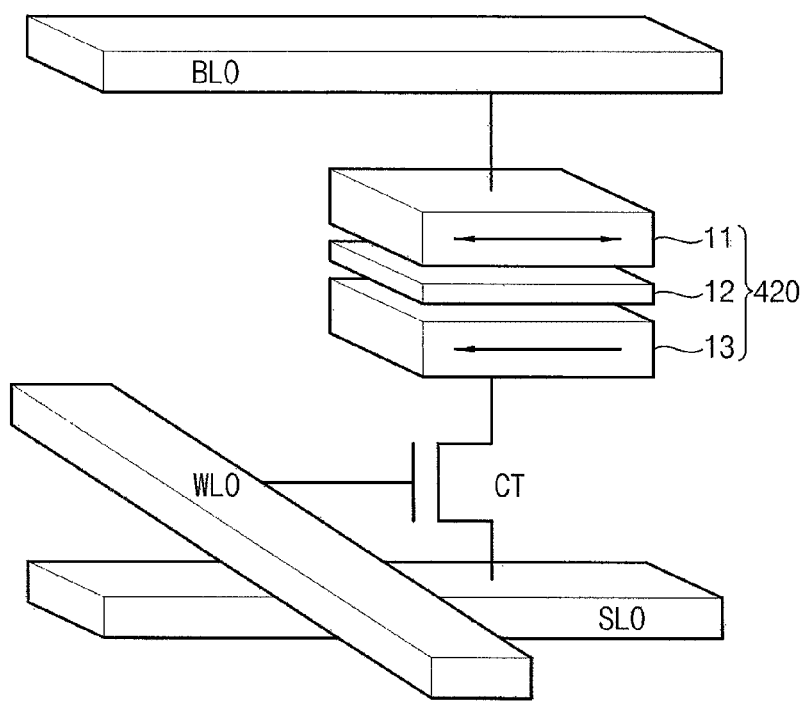
FIG. 4 is a diagram illustrating an example of a spin-transfer torque magneto-resistive random access memory (STT-MRAM) cell in the memory cell array of FIG. 3.

FIG. 4 is a diagram illustrating an example of a spin-transfer torque magneto-resistive random access memory (STT-MRAM) cell in the memory cell array of FIG. 3.

Referring to FIG. 4, the STT-MRAM cell may include an MTJ element 420 and a cell transistor CT. A gate of the cell transistor CT is coupled to a corresponding wordline WL0, a first electrode of the cell transistor CT is coupled to a corresponding bitline BL0 via the MTJ element 420, and a second electrode of the cell transistor CT is coupled to a source line SL0.

The MTJ element may include a pinned layer 13, a free layer 11 and a barrier layer 12 between the two layers 11 and 13. The magnetization direction of the pinned layer 13 is fixed but the magnetization direction of the free layer 11 may be varied, according to the written data, between the same direction as or opposite direction to the magnetization direction of the pinned layer 13. In example embodiments, an anti-ferromagnetic layer may be further included in the MTJ element to enforce the magnetization direction of the pinned layer 13.

For example, to perform the read operation of the STT-MRAM cell, a high level voltage is applied to the wordline WL0 to turn on the cell transistor CT, a read current is applied to flow from the bitline BL0 to the source line SL0, and the resistance value is measured to determine the data stored in the MTJ element 420.

Figure 5:
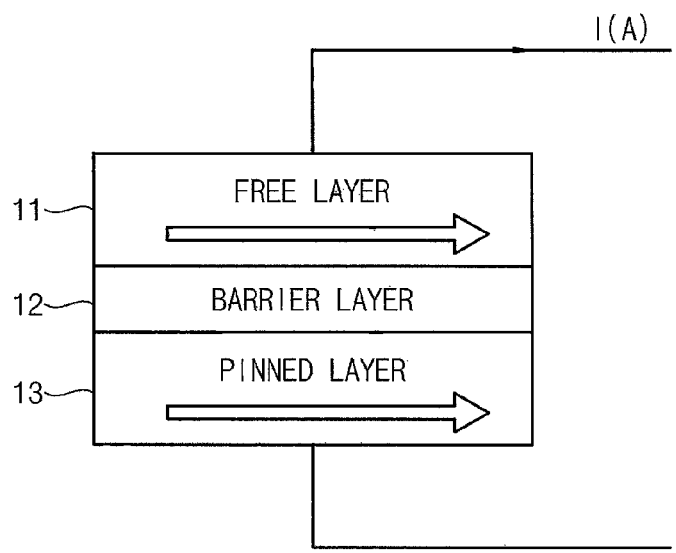
FIGS. 5 and 6 are diagrams illustrating magnetization directions of a magnetic tunnel junction (MTJ) element depending on written data.
Figure 6:
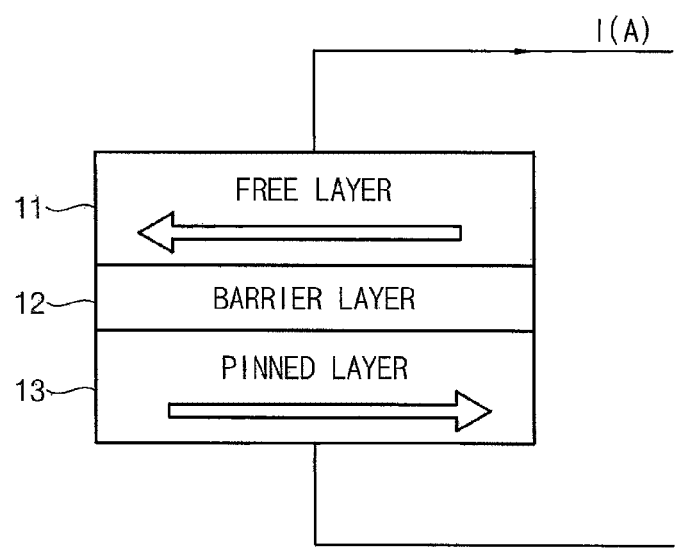

FIGS. 5 and 6 are diagrams illustrating magnetization directions of a magnetic tunnel junction (MTJ) element depending on written data.

FIGS. 5 and 6 illustrates the magnetization directions of an MTJ element and an example read operation. The resistance value of the MTJ element may be changed the magnetization direction of the free layer 11. When the read current I(A) is applied to the MTJ element, the data voltage depending on the resistance value of the MTJ element is output. The magnitude of the read current I(A) is much smaller than the magnitude of a write current and thus the magnetization direction of the free layer is not changed due to the read current I(A).

Referring to FIG. 5, the magnetization direction of the free layer 11 may be arranged parallel with the magnetization direction of the pinned layer 13. In this case, the MTJ element has a relatively smaller resistance value and the data '0' may be read out by applying the read current I(A).

Referring to FIG. 6, the magnetization direction of the free layer 11 may be arranged opposite to the magnetization direction of the pinned layer 13. In this case, the MTJ element has a relatively greater resistance value and the data '1' may be read out by applying the read current I(A).

Even though the free layer 11 and the pinned layer 13 having the horizontal magnetization are illustrated in FIGS. 5 and 6, the MTJ element may be implemented such that the free layer 11 and the pinned layer 13 have the vertical magnetization.

Figure 7:
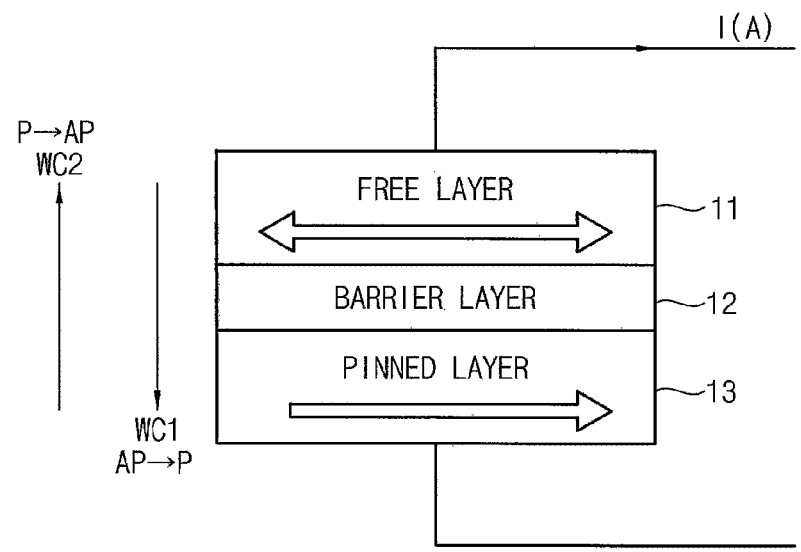
FIG. 7 is a diagram for describing a write operation of STT-MRAM cell.

FIG. 7 is a diagram for describing a write operation of STT-MRAM cell.

The magnetization direction of the free layer 11 may be determined depending on the write currents WC1 and WC2. For example, when the first write current WC1 is applied to the MTJ element, the free electrons having the same spin direction as the pinned layer 13 apply a torque to the free layer 11 and thus the free layer 11 is magnetized in the same direction as, that is, parallel direction (P) with the pinned layer 13. When the second write current WC2 is applied to the MTJ element, the free electrons having the opposite spin direction to the pinned layer 13 apply a torque to the free layer 11 and thus the free layer 11 is magnetized in the opposite direction as, that is, anti-parallel direction (AP) with the pinned layer 13. As such the magnetization direction of the free layer 11 in the MTJ element may be changed by the spin transfer torque (STT).

Figure 8:
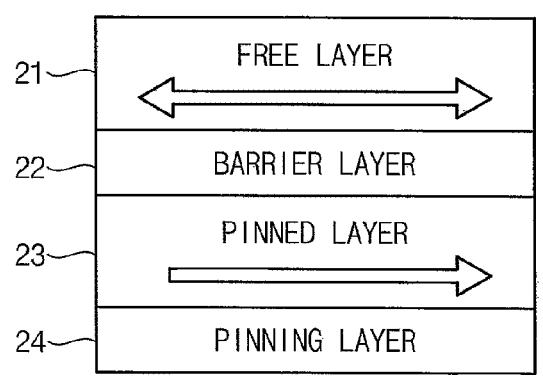
FIGS. 8, 9, 10, 11 and 12 are diagrams illustrating examples of the MTJ element in the STT-MRAM cell.
Figure 9:
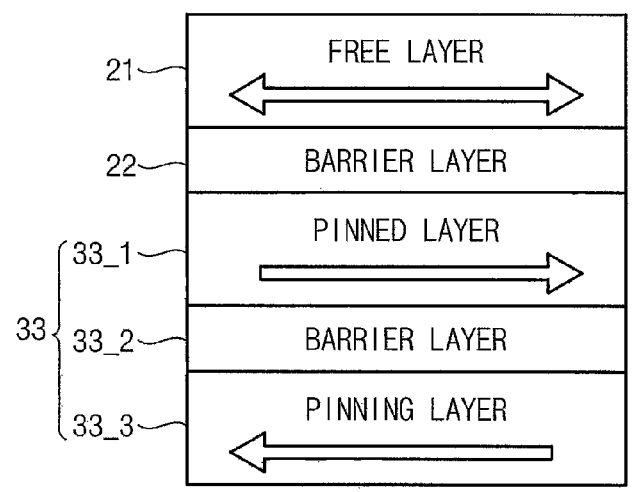

FIGS. 8 and 9 are diagrams illustrating examples of the MTJ element in the STT-MRAM cell. An MTJ element having the horizontal magnetization corresponds to a case that the direction of an applied current is perpendicular to the easy-magnetization axis.

Referring to FIG. 8, an MTJ element 20 may include a free layer 21, a barrier layer 22, a pinned layer 23 and a pinning layer 24.

The free layer 21 may include materials having a variable magnetization direction. The magnetization direction of the free layer 21 may be varied depending on internal and/or external electrical and/or magnetic factors. The free layer 21 may be implemented with ferromagnetic materials including at least one of cobalt (Co), iron (Fe) and nickel (Ni). For example, the free layer 21 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The barrier layer 22 may have a width shorter than a spin diffusion distance. The barrier layer 22 may be implemented with non-magnetic materials. For example, the barrier layer 22 may include at least one of Mg, Ti, Al, an oxide of MgZn or MgB, and a nitride of Ti or V.

The pinned layer 23 may have the magnetization direction that is fixed by the pinning layer 24. The pinned layer 23 may be implemented with ferromagnetic materials. For example, the pinned layer 23 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The pinning layer 24 may be implemented with anti-ferromagnetic materials. For example, the pinning layer 24 may include at least one of PtMn, IrMn, MnO, MnS, MnTe, MnF2, FeCl2, FeO, CoCl2, CoO, NiCl2, NiO and Cr.

Referring to FIG. 9, a fixed layer 33 in an MTJ element 30 may be implemented with synthetic anti-ferromagnetic (SAF). The fixed layer 33 may include a pinned layer 33_1, a barrier layer 33_2 and a pinning layer 33_3. Each of the pinned layer 33_1 and the pinning layer 33_3 may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12. The magnetization directions of the pinned layer 33_1 and the pinning layer 33_3 may be different from each other and the magnetization directions of the pinned layer 33_1 and the pinning layer 33_3 may be fixed, respectively. The barrier layer 33_2 may include Ru.

Figure 10:
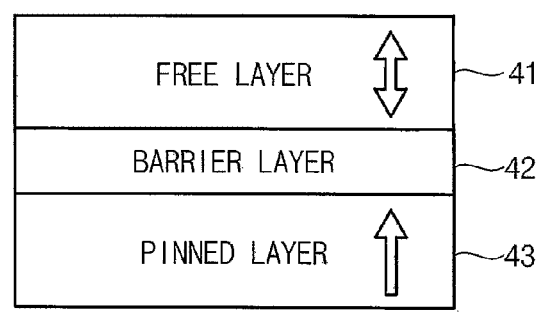

FIG. 10 is a diagram illustrating an example of the MTJ element in the STT-MRAM cell. An MTJ element having the vertical magnetization corresponds to a case that the direction of an applied current is parallel with the easy-magnetization axis.

The MTJ element 40 has a relatively smaller resistance when the magnetization direction of the free layer 41 is parallel with the magnetization direction of the pinned layer 43, and the MTJ element 40 has a relatively greater resistance when the magnetization direction of the free layer 41 is opposite to the magnetization direction of the pinned layer 43. The data may be stored as the resistance value.

For example, to implement the MTJ element 40 having the vertical magnetization, the free layer 41 and the pinned layer 43 may be implemented with materials having higher magnetic anisotropic energy such as alloys of amorphous rare-earth elements, multilayer thin films as (Co/Pt)n and (Fe/Pt)n, superlattice materials of L10 crystalline structure. The free layer 41 may be an ordered alloy including at least one of Fe, Co, Ni, Pa and Pt. For example, the free layer 41 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy including at least one of Fe, Co, Ni, Pa and Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

Figure 11:
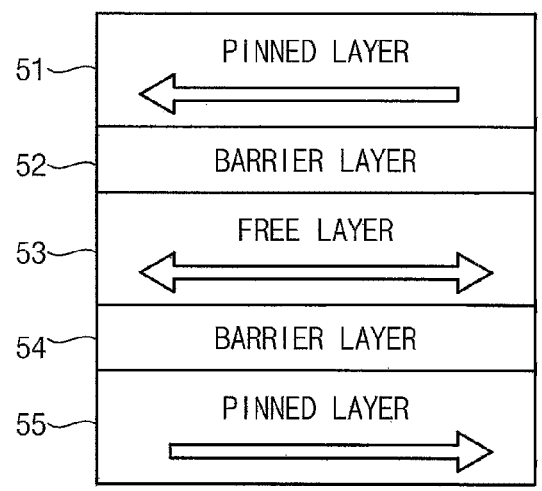
Figure 12:
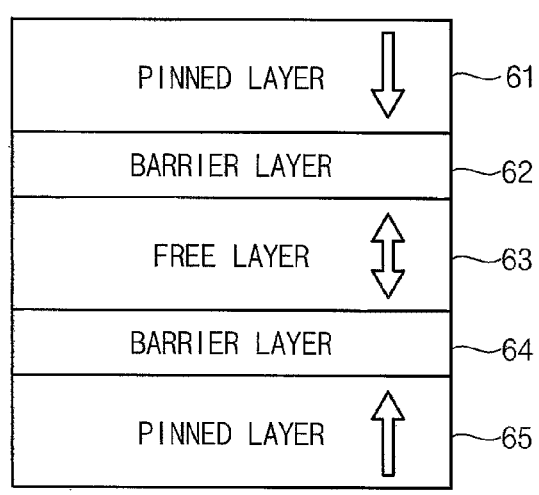

FIGS. 11 and 12 are diagrams illustrating examples of the MTJ element in the STT-MRAM cell. A dual MTJ element has a structure that two pinned layers and two barrier layers centered on a free layer.

Referring to FIG. 11, a dual MTJ element 50 forming horizontal magnetization may include a first barrier layer 51, a first barrier layer 52, a free layer 53, a second barrier layer 54 and a second pinned layer 55. The materials forming the respective layers may be the same as or similar to the materials of the free layer 21, the barrier layer 22 and the pinned layer 23 in FIG. 8.

In example embodiments, when the magnetization direction of the first pinned layer 51 is fixed in the opposite direction to the magnetization direction of the second pinned layer 55, the magnetic fields due to the first and second pinned layers 51 and 55 may be interfered destructively. Accordingly, data may be written in the dual MTJ element 50 using the smaller write current than the single MTJ element. Also the exact data may be read from the dual MTJ element 50 because the MTJ element 50 provides the greater resistance value due to the second barrier layer 54.

Referring to FIG. 12, a dual MTJ element 60 forming vertical magnetization may include a first barrier layer 61, a first barrier layer 62, a free layer 63, a second barrier layer 64 and a second pinned layer 65. The materials forming the respective layers may be the same as or similar to the materials of the free layer 41, the barrier layer 42 and the pinned layer 43 in FIG. 10.

In example embodiments, when the magnetization direction of the first pinned layer 61 is fixed in the opposite direction to the magnetization direction of the second pinned layer 65, the magnetic fields due to the first and second pinned layers 61 and 65 may be interfered destructively. Accordingly, data may be written in the dual MTJ element 60 using the smaller write current than the single MTJ element.

Figure 13:
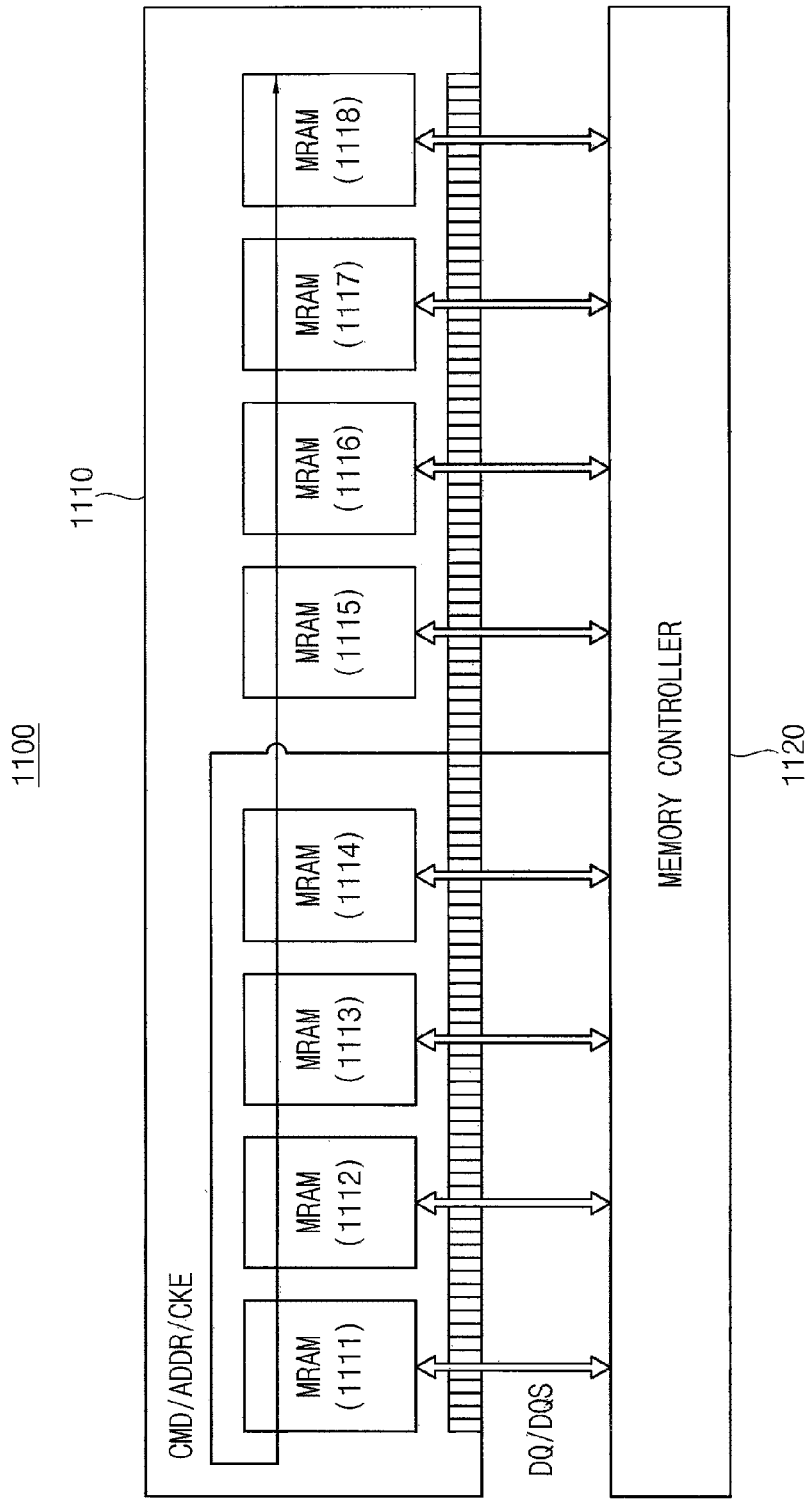
FIG. 13 is a block diagram illustrating a memory system according to example embodiments.

FIG. 13 is a block diagram illustrating a memory system according to example embodiments.

Referring to FIG. 13, a memory system 1100 includes a memory module 1110 and a memory controller 1120. The memory module 1110 may have a configuration of an unbuffered memory module. The memory module 1110 includes a plurality of memory chips 1111 through 1118, and each of the memory chips 1111 through 1118 may be a magneto-resistive random access memory (MRAM) disclosed herein.

In some exemplary embodiments, each of the memory chips and/or the memory controller 1120 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The memory controller 1120 sends a command CMD, an address signal ADDR, a clock enable signal CKE, data DQ and a data strobe signal DQS to the memory chips 1111 through 1118. The command CMD, the address signal ADDR and the clock enable signal CKE may be transferred sequentially from the first memory chip 1111 to the last memory chip 1118. The data DQ and the data strobe signal DQS may be one-to-one transferred to the respective memory chips 1111 through 1118. Thus the memory system 1100 require the read leveling test for adjusting the skew between the clock enable signal CKE and the data strobe signal DQS received by the respective memory chip.

Figure 14:
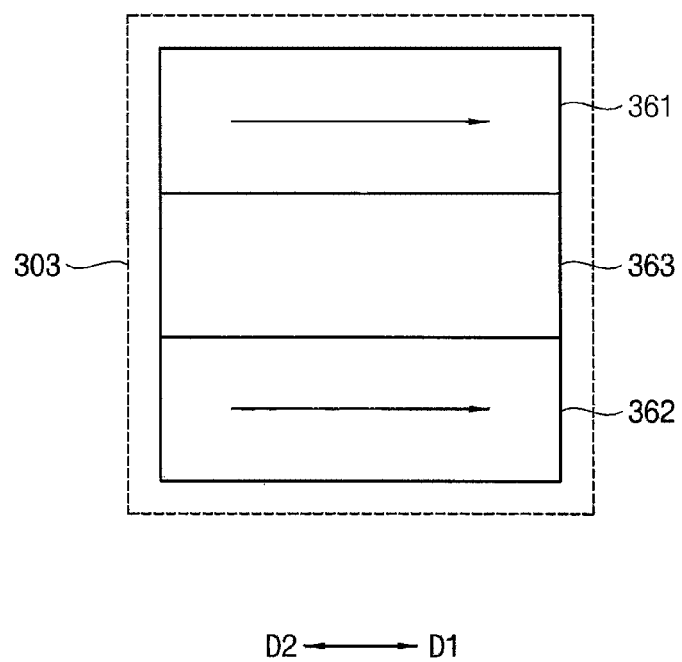
FIG. 14 is a diagram illustrating an example of a reference memory cell included in a reference region of the memory device of FIG. 1.
Figure 15:
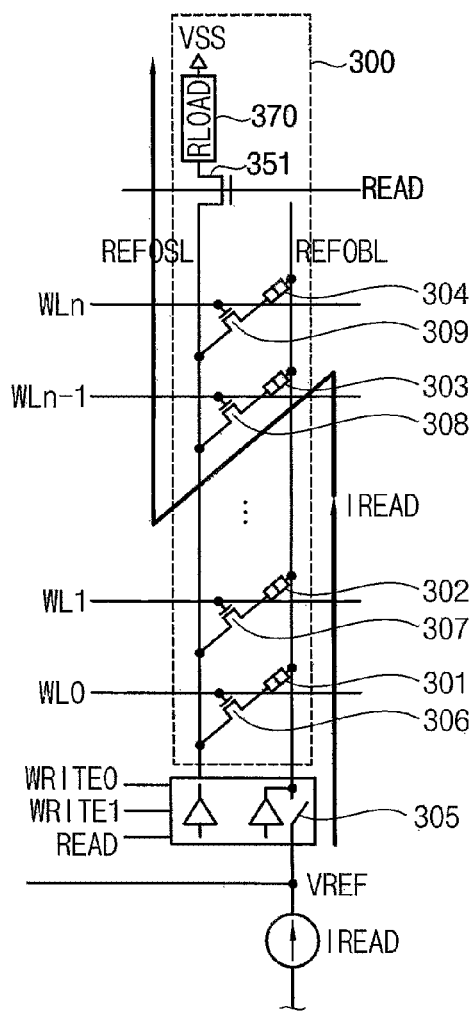
FIG. 15 is a diagram for describing an operation example of a reference region of the memory device of FIG. 1 according to example embodiments.
Figure 16:
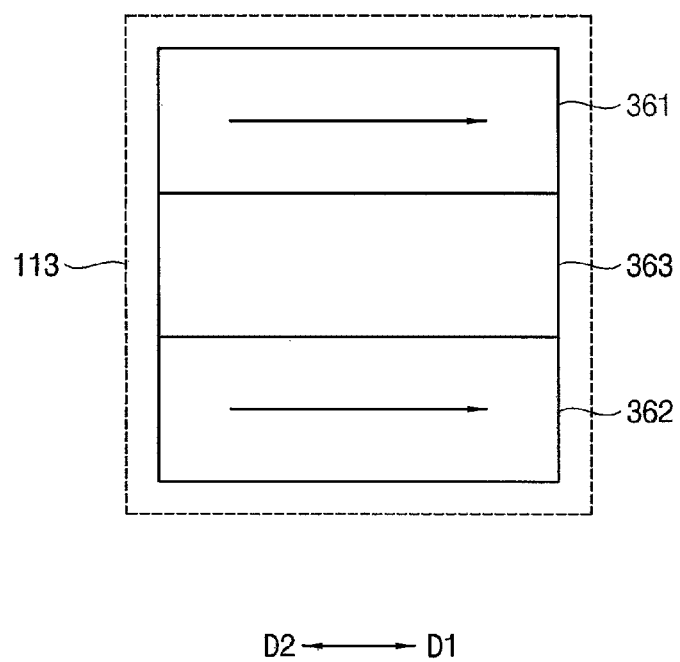
FIG. 16 is a diagram illustrating an example of a data memory cell included in a data region of the memory device of FIG. 1.
Figure 17:
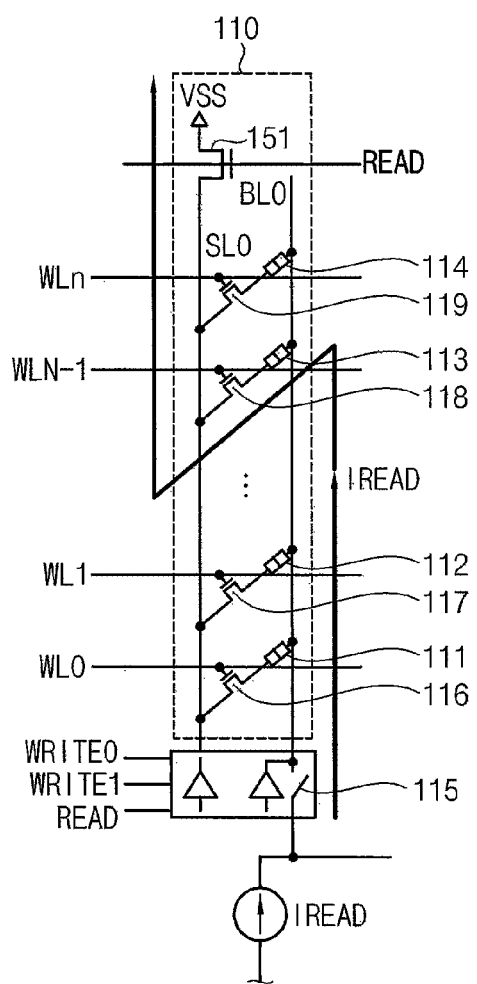
FIG. 17 is a diagram for describing an operation example of a data region of the memory device of FIG. 1 according to example embodiments.

FIG. 14 is a diagram illustrating an example of a reference memory cell included in a reference region of the memory device of FIG. 1, FIG. 15 is a diagram for describing an operation example of a reference region of the memory device of FIG. 1 according to example embodiments, FIG. 16 is a diagram illustrating an example of a data memory cell included in a data region of the memory device of FIG. 1, and FIG. 17 is a diagram for describing an operation example of a data region of the memory device of FIG. 1 according to example embodiments.

Referring to FIGS. 14 to 17, the reference memory cell element may include a first layer 361, a second layer 362 and a third layer 363. The first layer 361 may be a free layer, the second layer 362 may be a pinned layer and the third layer 363 may be a tunnel layer or a barrier layer. In example embodiments, a state of the reference memory cell may be a first state where a spin direction of a first layer 361 included in the reference memory cell element is equal to a spin direction of a second layer 362 included in the reference memory cell element.

For example, the third reference memory cell element 303 included in the reference region 300 may include the first layer 361, the second layer 362 and the third layer 363. The spin direction of the first layer 361 included in the third reference memory cell element 303 may be a first direction D1 and the spin direction of the second layer 362 included in the third reference memory cell element 303 may be the first direction D1. For example, the spin direction of the first layer 361 included in the third reference memory cell element 303 may be equal to the spin direction of the second reference memory cell element 303. When the spin direction of the first layer 361 included in the third reference memory cell element 303 is equal to the spin direction of the second layer 362 included in the third reference memory cell element 303, the state of the third reference memory cell element 303 may be the first state (e.g., a low resistance).

For example, as will be described in FIG. 31, the second reference memory cell element 302 included in the reference region 300 may include the first layer 361, the second layer 362 and the third layer 363. The spin direction of the first layer 361 included in the second reference memory cell element 302 may be the second direction D2 and the spin direction of the second layer 362 included in the second reference memory cell element 302 may be the first direction D1. For example, the spin direction of the first layer 361 included in the second reference memory cell element 302 may be different from the spin direction of the second layer 362 included in the second reference memory cell element 302. When the spin direction of the first layer 361 included in the second reference memory cell element 302 is different from the spin direction of the second layer 362 included in the second reference memory cell element 302, the state of the second reference memory cell element 302 may be a second state. For example, the second state disclosed herein, may correspond to a high resistance.

For example, a data memory cell may include the data memory cell element. The data memory cell element may include a first layer 361, a second layer 362 and a third layer 363. The first layer 361 may be the free layer, the second layer 362 may be the pinned layer and the third layer 363 may be the tunnel layer or the barrier layer. In example embodiments, a state of the data memory cell may be a first state where a spin direction of a first layer 361 included in the data memory cell is equal to a spin direction of a second layer 362 included in the data memory cell.

For example, the third data memory cell element 113 included in the data region 110 may include the first layer 361, the second layer 362 and the third layer 363. The spin direction of the first layer 361 included in the third data memory cell element 113 may be a first direction D1 and the spin direction of the second layer 362 included in the third data memory cell element 113 may be the first direction D1. For example, the spin direction of the first layer 361 included in the third data memory cell element 113 may be equal to the spin direction of the second layer 362 included in the third data memory cell element 113. When the spin direction of the first layer 361 included in the third data memory cell element 113 is equal to the spin direction of the second layer 362 included in the third data memory cell element 113, the state of the third data memory cell element 113 may be the first state (e.g., a low resistance).

For example, as will be described in FIG. 33, the second data memory cell element 112 included in the first data region 110 may include the first layer 361, the second layer 362 and the third layer 363. The spin direction of the first layer 361 included in the second data memory cell element 112 may be the second direction D2 and the spin direction of the second layer 362 included in the second data memory cell element 112 may be the first direction D1. For example, the spin direction of the first layer 361 included in the second data memory cell element 112 may be different from the spin direction of the second layer 362 included in the second data memory cell element 112. When the spin direction of the first layer 361 included in the second data memory cell element 112 is different from the spin direction of the second layer 362 included in the second data memory cell element 112, the state of the second data memory cell element 112 may be the second state (e.g., a high resistance).

For example, the data '0' may be stored in the third data memory cell element 113 included in the first data region 110. The third word line WLn-1 may be enabled to read the data of the third data memory cell element 113 included in the first data region 110. For example, the data switch 115 for the first data region 110 may be turned on based on a read signal READ. When the data switch 115 for the first data region 110 is turned on based on the read signal READ, the read current IREAD may be provided to the first data region 110 along the first bit line BL0. When the third word line WLn-1 is enabled and the read current IREAD is provided to the first data region 110 along the first bit line BL0, the read current IREAD may be provided to the first source line SL0 through the third data memory cell element 113 and the third data cell transistor 118. When the read current IREAD is provided to the first source line SL0 through the third data memory cell element 113 and the third data cell transistor 118, the read current IREAD may be provided to the ground voltage VSS through a data transistor 151 of the first data region 110. For example, the voltage of the first bit line BL0 may be the data voltage DATA_V. The data voltage DATA_V may be a voltage corresponding to the data '0'.

In example embodiments, in the reference region 300, a reference switch 305 may be turned on based on the read signal READ. When the reference switch 305 is turned on based on the read signal READ, the read current IREAD may be provided to the reference region 300 along the reference bit line REF0BL. When the third word line WLn-1 is enabled and the read current IREAD is provided to the reference region 300 along the reference bit line REF0BL, the read current IREAD may be provided to the reference source line REF0SL through the third reference memory cell element 303 and the third reference cell transistor 308. When the read current IREAD is provided to the reference source line REF0SL through the third reference memory cell element 303 and the third reference cell transistor 308, the read current IREAD may be provided to the ground voltage VSS through a reference transistor 351 and the resistor circuit 370. For example, a voltage of the reference bit line REF0BL may be the reference voltage VREF.

When the resistance value of the resistor circuit 370 is greater than 0, the reference voltage VREF may be greater than the data voltage DATA_V corresponding to data '0'. For example, the data voltage DATA_V may be the voltage of the first bit line BL0 and the reference voltage VREF may be the voltage of the reference bit line REF0BL. The reference region 300 may include the resistor circuit 370. When the resistance value of the resistor circuit 370 is greater than 0, the voltage drop may be generated by the read current IREAD that is transferred to the resistor circuit 370. When the voltage drop is generated by the read current IREAD that is transferred to the resistor circuit 370, the reference voltage VREF that is the voltage of the reference bit line REF0BL may be greater than the data voltage DATA_V that is the voltage of the first bit line BL0. For example, the sense amplifier 500 may compare the data voltage DATA_V and the reference voltage VREF. When the reference voltage VREF is greater than the data voltage DATA_V, the sense amplifier 500 may provide the output data D_OUT corresponding to data '0'.

The memory device 10 according to example embodiments may increase the performance by providing the reference voltage VREF based on the resistance of the resistor circuit 370 that is connected to the reference source line REF0SL.

In example embodiments, the reference region 300 may include a reference transistor 351 connecting between the reference source line REF0SL and the resistor circuit 370. Each of the data regions 110, 120, 130, and 140 may include a data transistor connecting between a corresponding source line and a ground voltage VSS. The reference transistor 351 and the respective data transistors may be turned on based on a read signal READ. In example embodiments, the read signal READ may activate when the memory device 10 is in a read operation and may deactivate when the memory device 10 is in a write operation.

For example, when the read signal READ is a first logic level, the reference transistor 351 may be turned off. When the reference transistor 351 is turned off, providing the signal of the reference source line REF0SL to the resistor circuit 370 through the reference transistor 351 may be blocked. For example, when the read signal READ is a second logic level, the reference transistor 351 may be turned on. When the reference transistor 351 is turned on, the signal of the reference source line REF0SL may be transferred to the resistor circuit 370 through the reference transistor 351. For example, the reference transistor 351 may be turned on during the read operation of the memory device 10. In case the reference transistor 351 is turned on during the read operation of the memory device 10, the read current IREAD that is provided to the reference source line REF0SL may be transferred to the resistor circuit 370 through the reference transistor 351.

In example embodiments, the data transistors may include a first data transistor 151, a second data transistor 152, a third data transistor 153 and a fourth data transistor 154. The first data transistor 151 may included in the first data region 110, the second data transistor 152 may included in the second data region 120, the third data transistor 153 may included in the third data region 130 and the fourth data transistor 154 may included in the fourth data region 140. For example, when the read signal READ is a first logic level, the first data transistor 151 may be turned off. When the first data transistor 151 is turned off, providing the signal of the first source line SL0 to the ground voltage VSS through the first data transistor 151 may be blocked. For example, when the read signal READ is the second logic level, the first data transistor 151 may be turned on. When the first data transistor 151 is turned on, the signal of the first source line SL0 may be transferred to the ground voltage VSS through the first data transistor 151. For example, the first data transistor 151 may be turned on during the read operation of the memory device 10. When the first data transistor 151 is turned on during the read operation of the memory device 10, the read current IREAD that is provided to the first source line SL0 may be transferred to the ground voltage VSS through the first data transistor 151.

In certain embodiments, when the read signal READ is the first logic level, the second data transistor 152 may be turned off. When the second data transistor 152 is turned off, providing the signal of the second source line SL1 to the ground voltage VSS through the second data transistor 152 may be blocked. For example, when the read signal READ is the second logic level, the second data transistor 152 may be turned on. When the second data transistor 152 is turned on, the signal of the second source line SL1 may be transferred to the ground voltage VSS through the second data transistor 152. For example, the second data transistor 152 may be turned on during the read operation of the memory device 10. When the second data transistor 152 is turned on during the read operation of the memory device 10, the read current IREAD that is provided to the second source line SL1 may be transferred to the ground voltage VSS through the second data transistor 152. In certain embodiments, when the read signal READ is the first logic level, the third data transistor 153 may be turned off. In case the third data transistor 153 is turned off, providing the signal of the third source line SL2 to the ground voltage VSS through the third data transistor 153 may be blocked. For example, when the read signal READ is the second logic level, the third data transistor 153 may be turned on. When the third data transistor 153 is turned on, the signal of the third source line SL2 may be transferred to the ground voltage VSS through the third data transistor 153. For example, the third data transistor 153 may be turned on during the read operation of the memory device 10. When the third data transistor 153 is turned on during the read operation of the memory device 10, the read current IREAD that is provided to the third source line SL2 may be transferred to the ground voltage VSS through the third data transistor 153.

In certain embodiments, when the read signal READ is the first logic level, the fourth data transistor 154 may be turned off. When the fourth data transistor 154 is turned off, providing the signal of the fourth source line SLn to the ground voltage VSS through the fourth data transistor 154 may be blocked. For example, when the read signal READ is the second logic level, the fourth data transistor 154 may be turned on. When the fourth data transistor 154 is turned on, the signal of the fourth source line SLn may be transferred to the ground voltage VSS through the fourth data transistor 154. For example, the fourth data transistor 154 may be turned on during the read operation of the memory device 10. When the fourth data transistor 154 is turned on during the read operation of the memory device 10, the read current IREAD that is provided to the fourth source line SLn may be transferred to the ground voltage VSS through the fourth data transistor 154.

Figure 18:
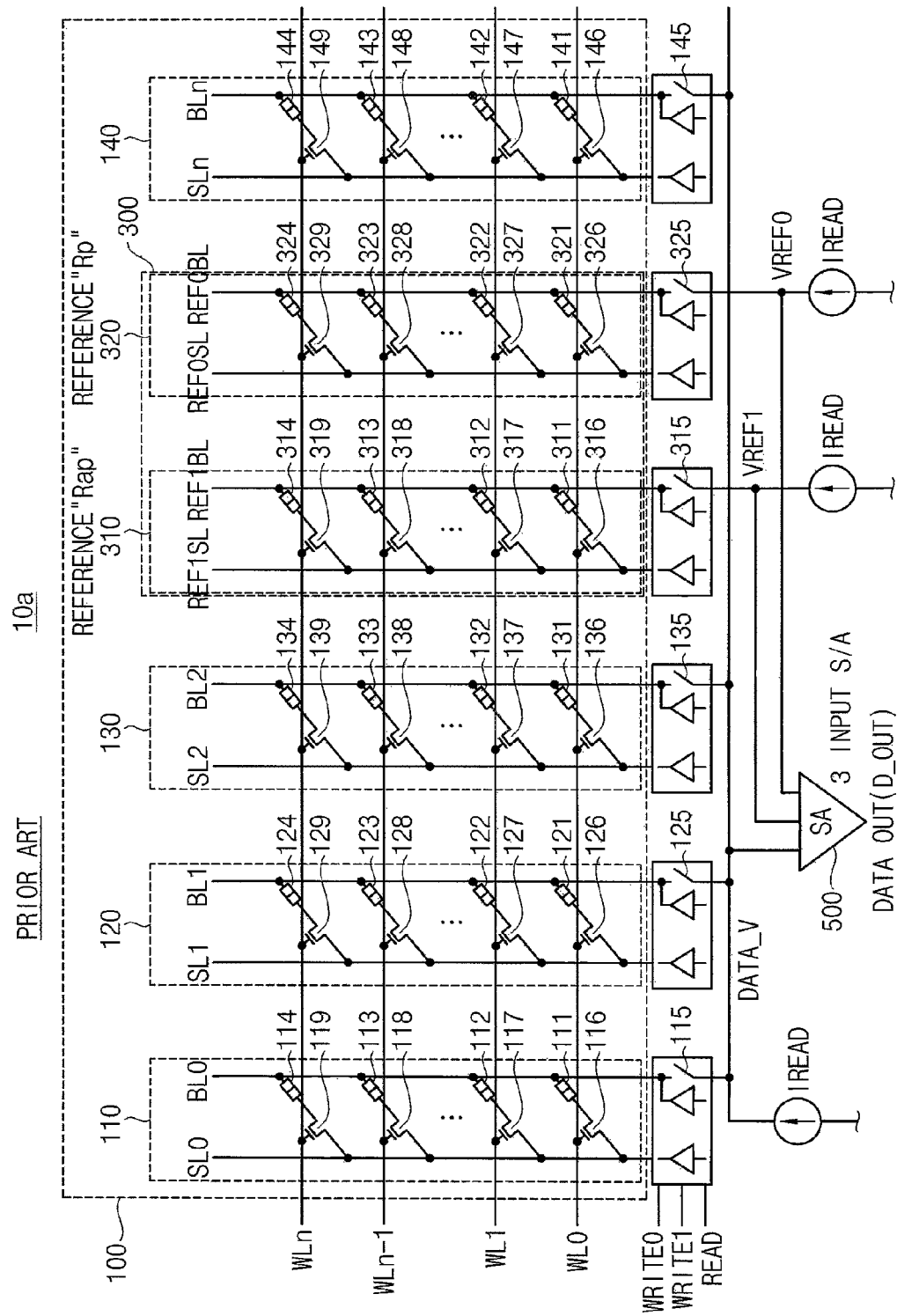
FIG. 18 is a diagram illustrating a conventional memory device including a data region and a reference region.

FIG. 18 is a diagram illustrating a conventional memory device including a data region and a reference region.

Referring to FIG. 18, a conventional memory device 10a includes a memory cell array 100 and a sense amplifier 500. The memory cell array 100 includes data regions 110, 120, 130, and 140, and a reference region 300. The data regions 110, 120, 130, and 140 provide a data voltage DATA_V corresponding to data stored in data memory cells. The data regions 110, 120, 130, and 140 include a plurality of data memory cells that are disposed between bit lines and source lines. For example, the data regions 110, 120, 130, and 140 may include a first data region 110, a second data region 120, a third data region 130 and a fourth data region 140. The first data region 110 may include first to fourth data memory cell elements 111 to 114 that are disposed between a first bit line BL0 and a first source line SL0. The second data region 120 may include a fifth to eighth data memory cells 121 to 124 that are disposed between a second bit line BL1 and a second source line SL1. The third data region 130 may include a ninth to twelfth data memory cells 131 to 134 that are disposed between a third bit line BL2 and a third source line SL2. The fourth data region 140 may include a thirteenth to sixteenth data memory cells 141 to 144 that are disposed between a fourth bit line BLn and a fourth source line SLn.

Figure 19:
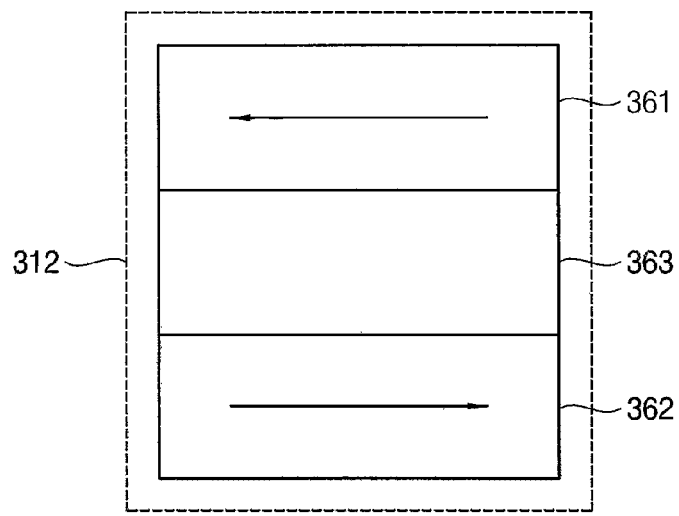
FIG. 19 is a diagram illustrating an example of a reference memory cell included in a first reference region of the memory device of FIG. 18.
Figure 20:
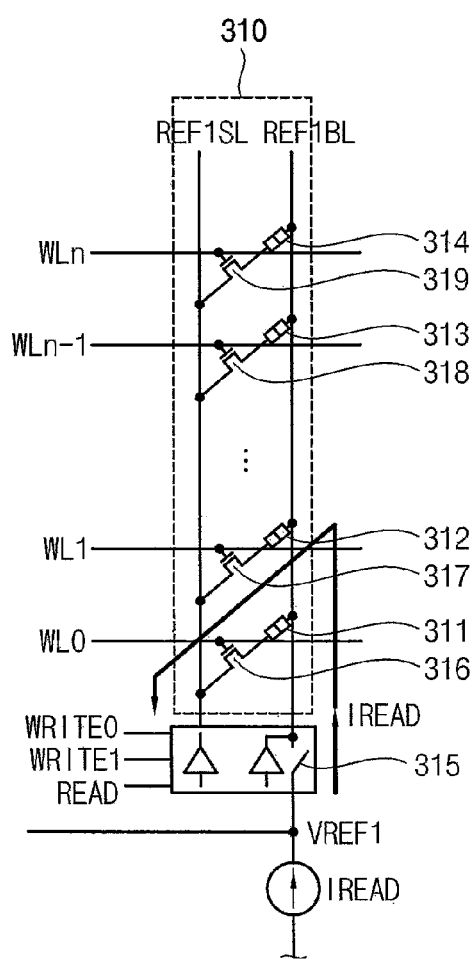
FIG. 20 is a diagram for describing an operation example of a first reference region of the memory device of FIG. 18.
Figure 21:
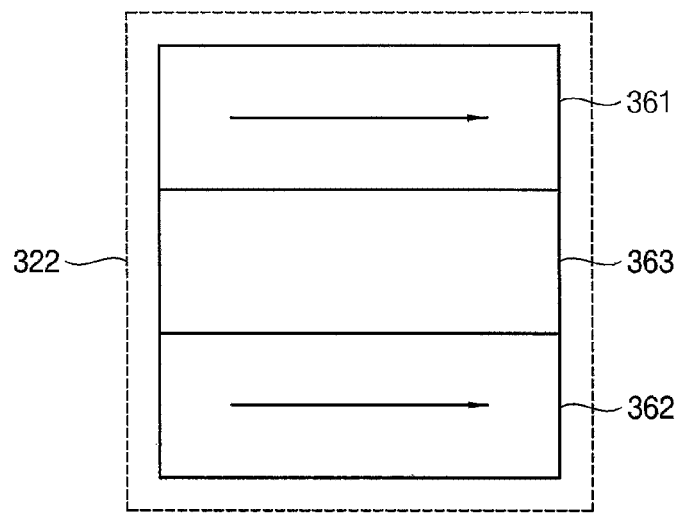
FIG. 21 is a diagram illustrating an example of a reference memory cell included in a second reference region of the memory device of FIG. 18.
Figure 22:
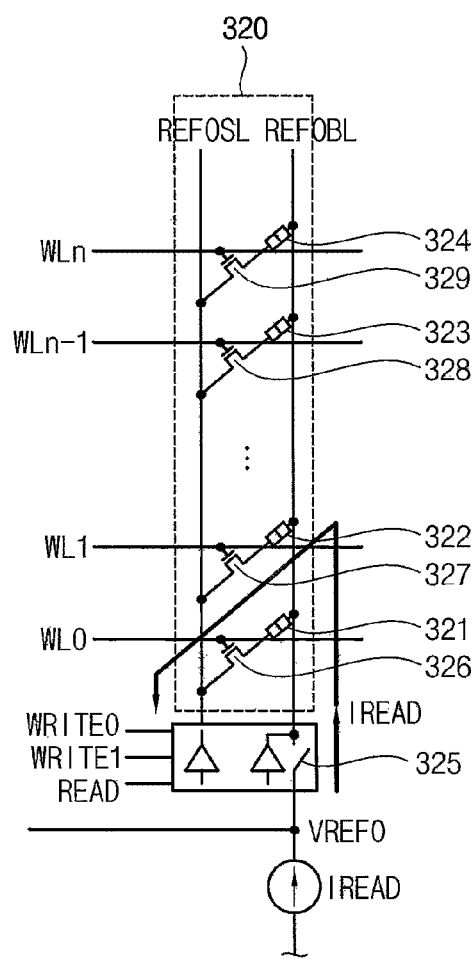
FIG. 22 is a diagram for describing an operation example of a second reference region of the memory device of FIG. 18.

FIG. 19 is a diagram illustrating an example of a reference memory cell included in a first reference region of the memory device of FIG. 18, FIG. 20 is a diagram for describing an operation example of the first reference region of the memory device of FIG. 18, FIG. 21 is a diagram illustrating an example of a reference memory cell included in a second reference region of the memory device of FIG. 18, and FIG. 22 is a diagram for describing an operation example of the second reference region of the memory device of FIG. 18.

Referring to FIGS. 18 to 22, the reference region 300 may include a first reference region 310 and a second reference region 320. The first reference region 310 includes a plurality of reference memory cells that are disposed between a first reference bit line REF1BL and a first reference source line REF1SL. For example, the first reference region 310 may include a plurality of first reference memory cells. The first reference memory cells may include first to fourth reference memory cell elements 311 to 314 and first to fourth reference cell transistors 316 to 319 that are disposed between the first reference bit line REF1BL and the first reference source line REF1SL. Each state of the first to fourth reference memory cell elements 311 to 314 may be the same as each other. For example, the spin direction of the first layer 361 included in the first to fourth reference memory cell elements 311 to 314 may be the second direction D2 and the spin direction of the second layer 362 included in the first to fourth reference memory cell elements 311 to 314 may be the first direction D1. In this case, each state of the first to fourth reference memory cell elements 311 to 314 may be the second state.

The second reference region 320 includes a plurality of reference memory cells that are disposed between the second reference bit line REF0BL and the second reference source line REF0SL. For example, the second reference region 320 may include a plurality of second reference memory cells. The second reference memory cells may include a fifth to eighth reference memory cells 321 to 324 that are disposed between the second reference bit line REF0BL and the second reference source line REF0SL. Each state of the fifth to eighth reference memory cell elements 321 to 324 may be the same as each other. For example, the spin direction of the first layer 361 included in the fifth to eighth reference memory cell elements 321 to 324 may be the first direction D1 and the spin direction of the second layer 362 included in the fifth to eighth reference memory cell elements 321 to 324 may be the first direction D1. In this case, each state of the fifth to eighth reference memory cell elements 321 to 324 may be the first state.

Figure 23:
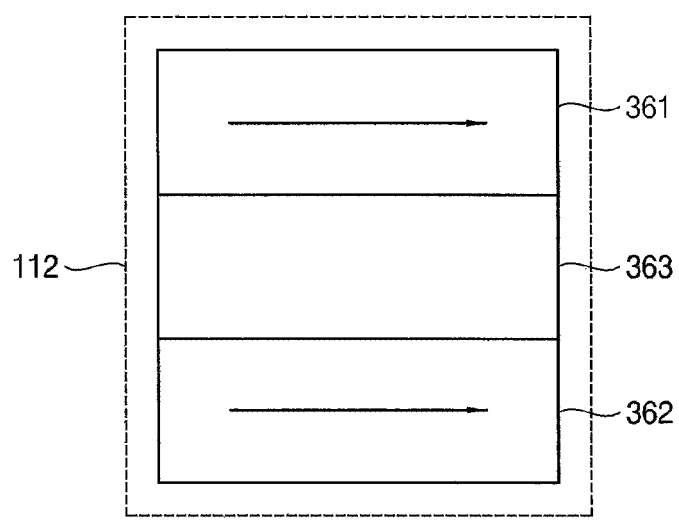
FIG. 23 is a diagram illustrating an example of a data memory cell included in a data region of the memory device of FIG. 18.
Figure 24:
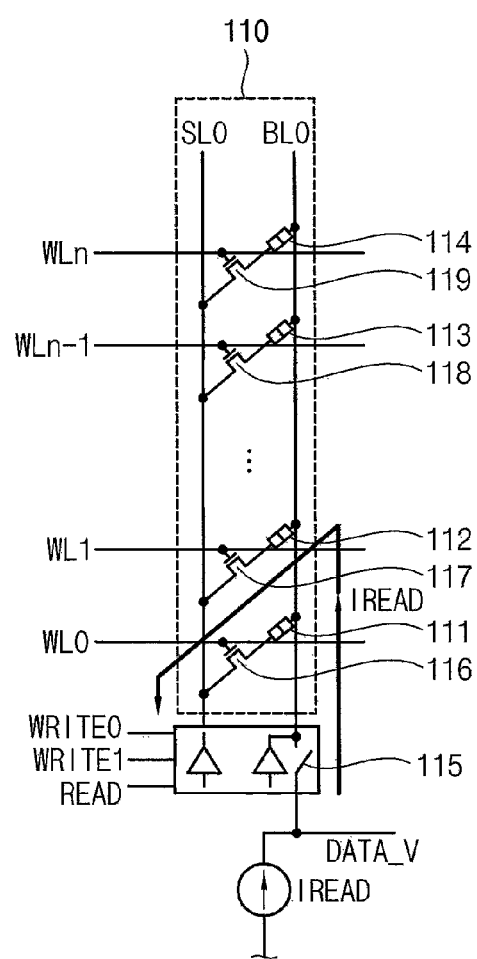
FIG. 24 is a diagram for describing an operation example of a data region of the memory device of FIG. 18.

FIG. 23 is a diagram illustrating an example of a data memory cell included in a data region of the memory device of FIG. 18 and FIG. 24 is a diagram for describing an operation example of a data region of the memory device of FIG. 18.

Referring to FIGS. 23 and 24, the second data memory cell element 112 included in the first data region 110 may include a first layer 361, a second layer 362 and a third layer 363. The first layer 361 may be the free layer, the second layer 362 may be the pinned layer and the third layer 363 may be the tunnel layer or the barrier layer. The second word line WL1 may be enabled to read the data of the second data memory cell element 112 included in the first data region 110.

In this case, in the data regions 110, 120, 130, and 140, a data switch 115 of the first data region 110 may be turned on based on a read signal READ. In case the data switch 115 of the first data region 110 is turned on based on the read signal READ, the read current IREAD may be provided to the first data region 110 along the first bit line BL0. In the case that the second word line WL1 is enabled and the read current IREAD is provided to the first data region 110 along the first bit line BL0, the read current IREAD may be provided to the first source line SL0 through the second data memory cell element 112 and the second data cell transistor 117. In the case that the read current IREAD is provided to the first source line SL0 through the second data memory cell element 112 and the second data cell transistor 117, the read current IREAD may be provided to the ground voltage VSS. In this case, the voltage of the first bit line BL0 may be the data voltage DATA_V.

In this case, in the first reference region 310, a first reference switch 315 may be turned on based on the read signal READ. In the case that the first reference switch 315 is turned on based on the read signal READ, the read current IREAD may be provided to the first reference region 310 along the first reference bit line REF1BL. In the case that the second word line WL1 is enabled and the read current IREAD is provided to the first reference region 310 along the first reference bit line REF1BL, the read current IREAD may be provided to the first reference source line REF1SL through the second reference memory cell element 312 and the second reference cell transistor 317. In the case that the read current IREAD is provided to the first reference source line REF1SL through the second reference memory cell element 312 and the second reference cell transistor 317, the read current IREAD may be provided to the ground voltage VSS. In this case, the voltage of the first reference bit line REF1BL may be the first reference voltage VREF1.

In addition, in the second reference region 320, a second reference switch 325 may be turned on based on the read signal READ. In the case that the second reference switch 325 is turned on based on the read signal READ, the read current IREAD may be provided to the second reference region 320 along the second reference bit line REF0BL. In the case that the second word line WL1 is enabled and the read current IREAD is provided to the second reference region 320 along the second reference bit line REF0BL, the read current IREAD may be provided to the second reference source line REF0SL through the sixth reference memory cell element 322 and the sixth reference cell transistor 327. In the case that the read current IREAD is provided to the second reference source line REF0SL through the sixth reference memory cell element 322 and the sixth reference cell transistor 327, the read current IREAD may be provided to the ground voltage VSS. In this case, the voltage of the second reference bit line REF0BL may be the second reference voltage VREF0 different from the first reference voltage VREF1.

The sense amplifier 500 may provide the output data D_OUT based on the data voltage DATA_V corresponding to the data stored in the data memory cell, the first reference voltage VREF1 and the second reference voltage VREF0. For example, the sense amplifier 500 may compare a middle value of the first reference voltage VREF1 and the second reference voltage VREF0 to the data voltage DATA_V. The data voltage DATA_V corresponding to the data '0' may be less than the middle value of the first reference voltage VREF1 and the second reference voltage VREF0. In this case the sense amplifier 500 may provide the output data D_OUT corresponding to the data '0'.

In case of the conventional memory device 10a, the first reference voltage VREF1 and the second reference voltage VREF0 may be generated using the first reference region 310 and the second reference region 320. However, the memory device 10 according to example embodiments may generate the reference voltage VREF based on the resistance value of the resistor circuit 370 that is connected between the reference source line REF0SL included in the reference region 300 and a ground voltage VSS. When the reference voltage VREF is generated based on the resistance value of the resistor circuit 370, the size of the reference region 300 may be decreased.

Figure 25:
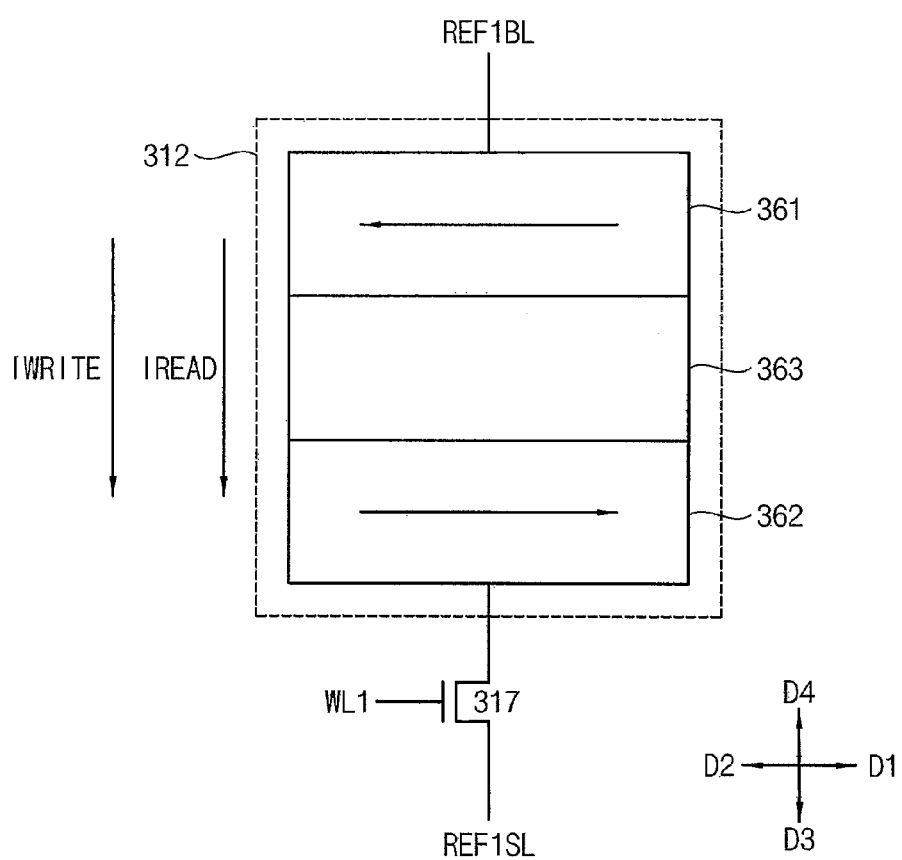
FIGS. 25 and 26 are diagrams describing for a read disturb error of the memory device of FIG. 18.
Figure 26:
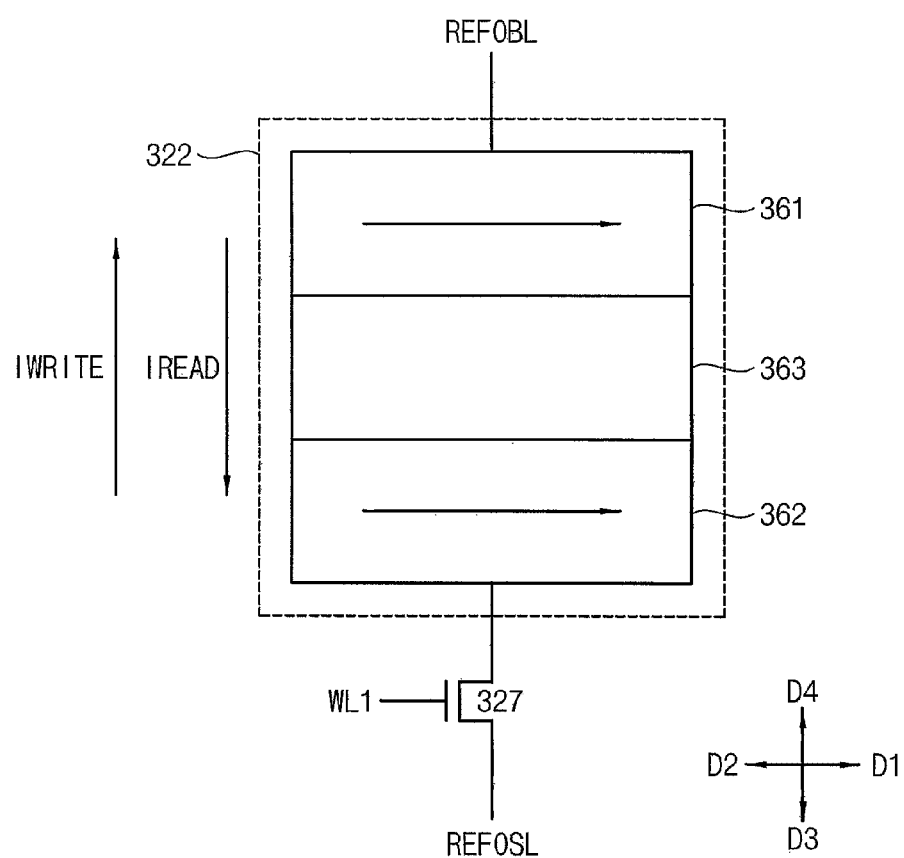

FIGS. 25 and 26 are diagrams describing for a read disturb error of the memory device of FIG. 18.

Referring to FIG. 25, the first reference region 310 may include the second reference memory cell element 312 and the second reference cell transistor 317. The second reference memory cell element 312 may include the first layer 361, the second layer 362 and the third layer 363. The spin direction of the first layer 361 included in the second reference memory cell element 312 may be the second direction D2 and the spin direction of the second layer 362 included in the second reference memory cell element 312 may be the first direction D1. In this case, the state of the second reference memory cell element 312 may be the second state. The read current IREAD may be transferred from the first reference bit line REF1BL to the first reference source line REF1SL in the read operation of the memory device 10a. The direction of the read current IREAD may be the third direction D3 in the read operation of the memory device 10.

In the write operation of the memory device 10a, the state of the second reference memory cell element 312 may be changed from the second state to the first state. A write current IWRITE may be provided to the second reference memory cell element 312 in the write operation of the memory device 10a. The direction of the write current IWRITE may be the third direction D3 in the write operation of the memory device 10a. In this case, the direction of the write current IWRITE in the write operation of the memory device 10a may be equal to the direction of the read current IREAD in the read operation of the memory device 10a. In the case that the direction of the write current IWRITE in the write operation of the memory device 10a is equal to the direction of the read current IREAD in the read operation of the memory device 10a, the state of the second reference memory cell element 312 may be changed from the second state to the first state during a certain read operation of the memory device 10a. If the state of the second reference memory cell element 312 is changed from the second state to the first state during the certain read operation of the memory device 10a, the error may be generated in the read operation of the memory device 10a. The error may be referred to as a read disturb error.

Referring to FIG. 26, the second reference region 320 may include the sixth reference memory cell element 322 and the sixth reference cell transistor 327. The sixth reference memory cell element 322 may include the first layer 361, the second layer 362 and the third layer 363. The spin direction of the first layer 361 included in the sixth reference memory cell 322 element may be the first direction D1 and the spin direction of the second layer 362 included in the sixth reference memory cell element 322 may be the first direction D1. In this case, the state of the sixth reference memory cell element 322 may be the first state. The read current IREAD may be transferred from the second reference bit line REF0BL to the second reference source line REF0SL in the read operation of the memory device 10a. The direction of the read current IREAD may be the third direction D3 in the read operation of the memory device 10a.

In the write operation of the memory device 10a, the state of the sixth reference memory cell element 322 may be changed from the first state to the second state. A write current IWRITE may be provided to the sixth reference memory cell element 322 in the write operation of the memory device 10a. The direction of the write current IWRITE may be the fourth direction D4 in the write operation of the memory device 10a. In this case, the direction of the write current IWRITE in the write operation of the memory device 10a may be different from the direction of the read current IREAD in the read operation of the memory device 10a. In the case that the direction of the write current IWRITE in the write operation of the memory device 10a is different from the direction of the read current IREAD in the read operation of the memory device 10a, the state of the sixth reference memory cell element 322 may not be changed from the first state to the second state during the read operation of the memory device 10a. If the state of the sixth reference memory cell element 322 is not changed from the first state to the second state during the read operation of the memory device 10a, the error may not be generated in the read operation of the memory device 10a.

Figure 27:
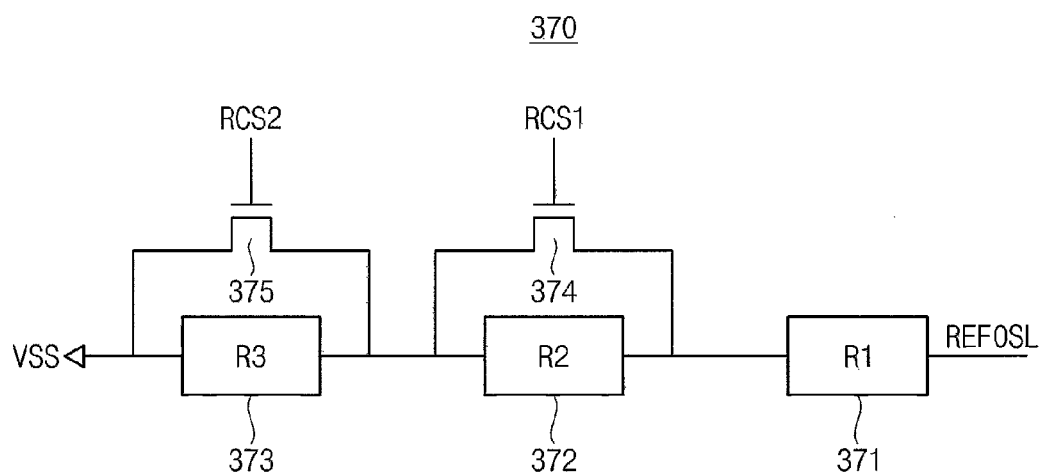
FIG. 27 is a diagram illustrating an example of a resistor circuit included in the memory device of FIG. 1 according to example embodiments.

FIG. 27 is a diagram illustrating an example of a resistor circuit included in the memory device of FIG. 1 according to example embodiments.

Referring to FIGS. 1 and 27, the resistor circuit 370 may include a first resistor 371, a second resistor 372, a third resistor 373, a first resistor transistor 374 and a second resistor transistor 375. In example embodiments, the resistor circuit 370 may be connected between the reference transistor 351 and the ground voltage VSS. For example, the resistor circuit 370 may include the first, second, and third resistors 371, 372, and 373 connected in series, and the first and second resistor transistors 374 and 375 connected in parallel to the second and third resistors 372 and 373, respectively. First and second resistor control signals RCS1 and RCS2 may control the first and second resistor transistors 374 and 375.

A voltage of the reference bit line REF0BL may be changed based on a resistance value of the resistor circuit 370. For example, the first resistor control signal RCS1 may be transferred to the gate of the first resistor transistor 374 and the second resistor control signal RCS2 may be transferred to the gate of the second resistor transistor 375. When the first resistor control signal RCS1 is a first logic level, the first resistor transistor 374 may be turned off. In addition, when the first resistor control signal RCS1 is a second logic level, the first resistor transistor 374 may be turned on. The first logic level may be a logic low level and the second logic level may be a logic high level. When the second resistor control signal RCS2 is the first logic level, the second resistor transistor 375 may be turned off and when the second resistor control signal RCS2 is the second logic level, the second resistor transistor 375 may be turned on.

For example, in one embodiment, when the first resistor control signal RCS1 and the second resistor control signal RCS2 are the first logic level, the resistance value of the resistor circuit 370 is R1+R2+R3. In addition, when the first resistor control signal RCS1 is the second logic level and the second resistor control signal RCS2 is the first logic level, the resistance value of the resistor circuit 370 is R1+R3. When the first resistor control signal RCS1 is the second logic level and the second resistor control signal RCS2 is the second logic level, the resistance value of the resistor circuit 370 is R1. Therefore, the resistance value of the resistor circuit 370 may be changed according to the first resistor control signal RCS1 and the second resistor control signal RCS2. The first resistor control signal RCS1 and the second resistor control signal RCS2 may be provided from the control logic circuit.

In example embodiments, a third resistor transistor 376 (not shown) may be connected to the first resistor 371 in parallel and a third resistor control signal RCS3 (not shown) may control the third resistor transistor 376. For example, the resistance value of the resistor circuit 370 is '0' when the resistor transistors 374, 375, and 376 are turned on.

In example embodiments, the voltage of the reference bit line REF0BL may be increased as the resistance value of the resistor circuit 370 is increased and the voltage of the reference bit line REF0BL may be decreased as the resistance value of the resistor circuit 370 is decreased. For example, the third word line WLn−1 may be enabled to read the data of the third data memory cell element 113 included in the first data region 110. For example, in the reference region 300, a reference switch 305 may be turned on based on the read signal READ. When the reference switch 305 is turned on based on the read signal READ, the read current IREAD may be provided to the reference region 300 along the reference bit line REF0BL. When the third word line WLn−1 is enabled and the read current IREAD is provided to the reference region 300 along the reference bit line REF0BL, the read current IREAD may be provided to the reference source line REF0SL through the third reference memory cell element 303 and the third reference cell transistor 308. When the read current IREAD is provided to the reference source line REF0SL through the third reference memory cell element 303 and the third reference cell transistor 308, the read current IREAD may be provided to the ground voltage VSS through a reference transistor 351 and the resistor circuit 370. For example, the voltage of the reference bit line REF0BL may be the reference voltage VREF. The reference transistor 351 may be a NMOS transistor.

When the resistance value of the resistor circuit 370 is 0, the reference voltage VREF that is provided from the reference region 300 may be a reference voltage VREF corresponding to data '0'. The reference voltage VREF that is provided from the reference region 300 may be increased as the resistance value of the resistor circuit 370 is increased. In addition, the reference voltage VREF that is provided from the reference region 300 may be decreased as the resistance value of the resistor circuit 370 is decreased. Therefore, when the resistance value of the resistor circuit 370 is controlled, the reference voltage VREF that is provided from the reference region 300 may be used to determine whether the data voltage DATA_V from each of the data regions 110, 120, 130, and 140 is a voltage corresponding to data '0' or a voltage corresponding to data '1'.

In example embodiments, the memory device 10 may control the resistance value of the resistor circuit 370 based on one or more resistor control signals. For example, when the resistor control signal is a first logic level, the resistance value of the resistor circuit 370 may be increased. In addition, when the resistor control signal is a second logic level, the resistance value of the resistor circuit 370 may be decreased.

Figure 28:
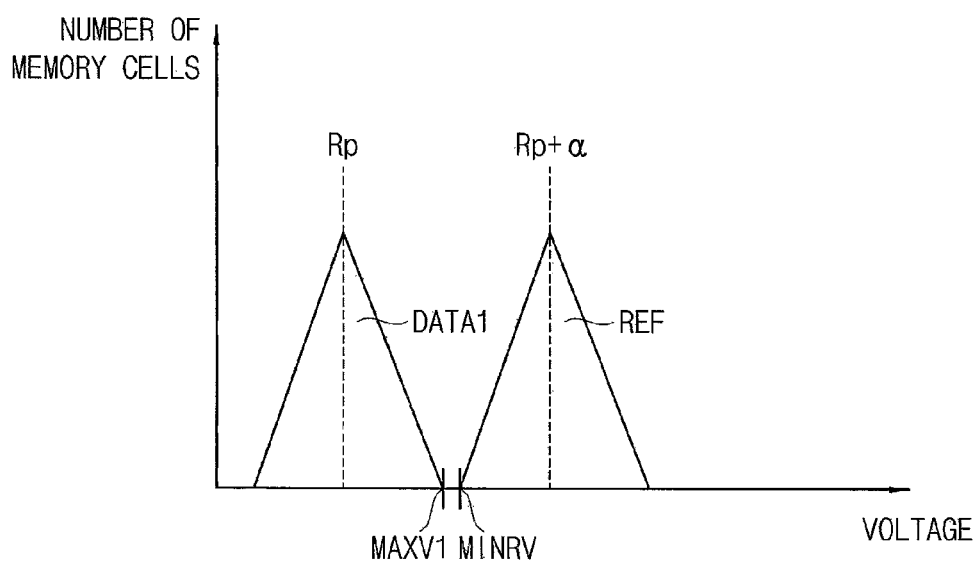
FIG. 28 is a diagram illustrating a voltage distribution of reference memory cells and a voltage distribution of a first set of data memory cells when first data is stored in the first set of data memory cells according to example embodiments.

FIG. 28 is a diagram illustrating a voltage distribution of reference memory cells and a voltage distribution of a first set of data memory cells when first data is stored in the first set of data memory cells according to example embodiments.

Referring to FIGS. 1 and 28, for example, the reference memory cells may include the first to fourth reference memory cell elements 301 to 304. A minimum value in a voltage distribution of the first to fourth reference memory cell elements 301 to 304 may be the reference minimum voltage MINRV. The first set of data memory cells that have first data DATA1 among the data memory cells may include the first to fourth data memory cell elements 111 to 114. For example, each of the first to fourth data memory cell elements 111 to 114 may have the first data DATA1. A maximum value in a voltage distribution of the first to fourth data memory cell elements 111 to 114 may be a first data maximum voltage MAXV1. In example embodiments, the reference minimum voltage MINRV may be greater than the first maximum voltage MAXV1. The reference minimum voltage MINRV may be a minimum value in a voltage distribution of the reference memory cells. The first data maximum voltage MAXV1 may be a maximum value in a voltage distribution of the first set of data memory cells that have the first data DATA1 among the data memory cells. The first data DATA1 may be the data '0'. However, the first data DATA1 may be the data '1'.

Figure 29:
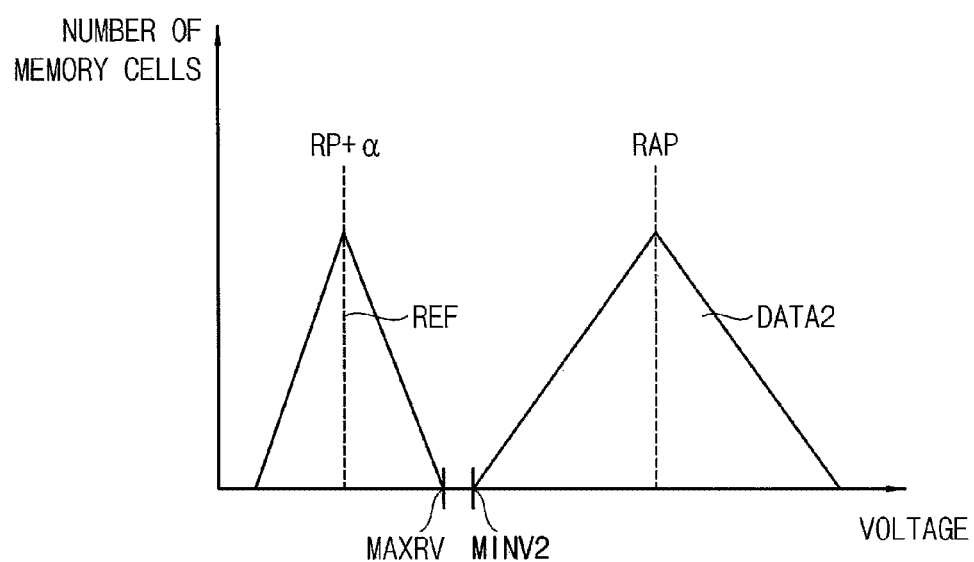
FIG. 29 is a diagram illustrating a voltage distribution of reference memory cells and a voltage distribution of a second set of data memory cells when second data is stored in the second set of data memory cells according to example embodiments.

FIG. 29 is a diagram illustrating a voltage distribution of reference memory cells and a voltage distribution of a second set of data memory cells when second data is stored in the second set of data memory cells according to example embodiments.

Referring to FIGS. 1 and 29, for example, the reference memory cells may include the first to fourth reference memory cell elements 301 to 304. A maximum value in a voltage distribution of the first to fourth reference memory cell elements 301 to 304 may be the reference maximum voltage MAXRV. The second set of data memory cells that have second data DATA2 among the data memory cells may include the fifth to eighth data memory cell elements 121 to 124. Each of the fifth to eighth data memory cell elements 121 to 124 may have the second data DATA2. A minimum value in a voltage distribution of the fifth to eighth data memory cell elements 121 to 124 may be a second data minimum voltage MINV2. In example embodiments, the reference maximum voltage MAXRV may be less than the second data minimum voltage MINV2. The reference maximum voltage MAXRV may be a maximum value in a voltage distribution of the reference memory cells. The second data minimum voltage MINV2 may be a minimum value in a voltage distribution of the second set of data memory cells that have the second data DATA2 among the data memory cells. The second data DATA2 may be the data '1'. However, the second data DATA2 may be the data '0'.

Figure 30:
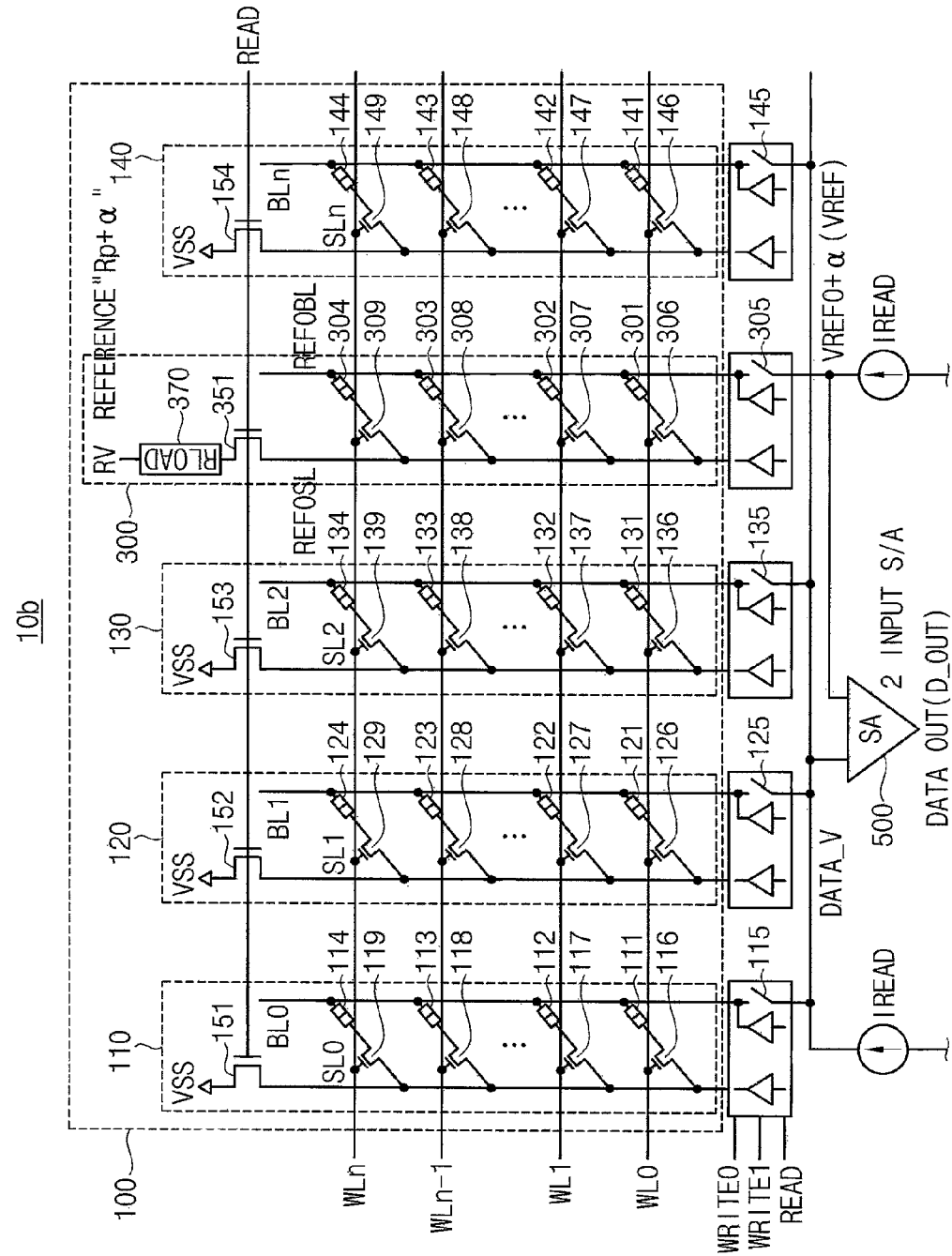
FIG. 30 is a diagram illustrating a memory device according to example embodiments.
Figure 31:
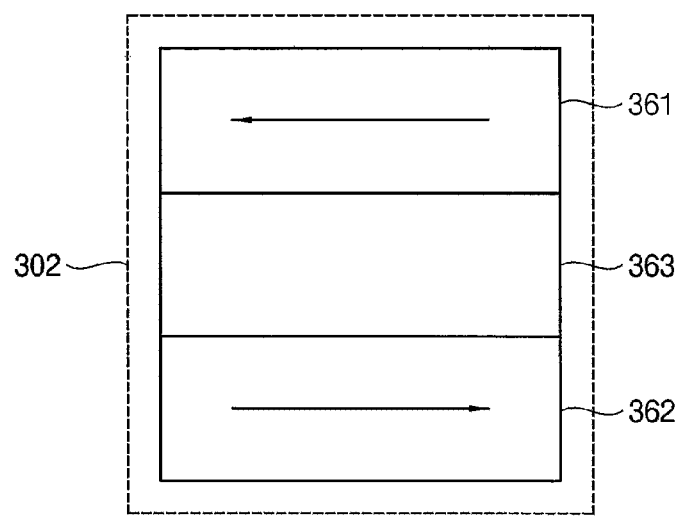
FIG. 31 is a diagram illustrating an example of a reference memory cell included in a reference region of the memory device of FIG. 30.
Figure 32:
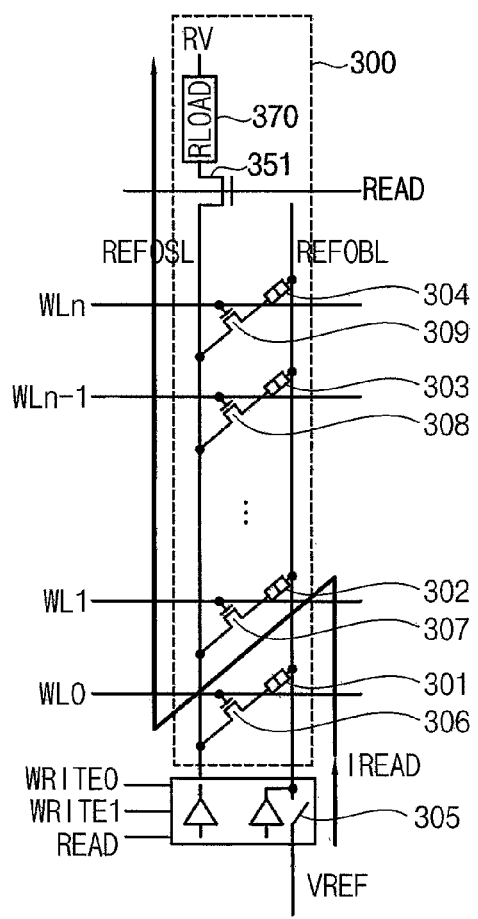
FIG. 32 is a diagram for describing an operation example of a reference region of the memory device of FIG. 30 according to example embodiments.

Referring to FIGS. 30 to 32, a memory device 10b includes a memory cell array 100 and a sense amplifier 500. The memory cell array 100 includes data regions 110, 120, 130, and 140 and a reference region 300. Each of the data regions 110, 120, 130, and 140 may provide a data voltage DATA_V corresponding to data stored in data memory cells. The data region 110, 120, 130, and 140 may include a plurality of data memory cells. The plurality of data memory cells that are disposed between bit lines and source lines. The plurality of data memory cells may include data memory cell elements 111 to 114, 121 to 124, 131 to 134, and 141 to 144 (e.g., magnetic tunnel junction (MTJ) elements) and data cell transistors 116 to 119, 126 to 129, 136 to 139, and 146 to 149 that are disposed between bit lines BL0, BL1, BL2, and BLn and source lines SL0, SL1, SL2, and SLn, respectively. For example, according to certain embodiments, a data memory cell includes a data memory cell element (e.g., a magnetic tunnel junction (MTJ) element) and a data cell transistor connected to each other. For example, the data regions 110, 120, 130, and 140 may include a first data region 110, a second data region 120, a third data region 130 and a fourth data region 140. The first data region 110 may include the first to fourth data memory cell elements 111 to 114 that are disposed between a first bit line BL0 and a first source line SL0. In addition, the second data region 120 may include a fifth to eighth data memory cell elements 121 to 124 that are between a second bit line BL1 and a second source line SL1. The third data region 130 may include a ninth to twelfth data memory cell elements 131 to 134 that are between a third bit line BL2 and a third source line SL2. The fourth data region 140 may include a thirteenth to sixteenth data memory cell elements 141 to 144 that are between a fourth bit line BLn and a fourth source line SLn.

The reference region 300 may include a plurality of reference memory cells that are between a reference bit line REF0BL and a reference source line REF0SL. For example, the plurality of reference memory cells may include the first to fourth reference memory cell elements 301 to 304 and reference cell transistors 306 to 309 that are disposed between the reference bit line REF0BL and the reference source line REF0SL. Each state of the first to fourth reference memory cell elements 301 to 304 may be the same. For example, the spin direction of the first layer 361 included in each of the first to fourth reference memory cell elements 301 to 304 may be the second direction D2 and the spin direction of the second layer 362 included in each of the first to fourth reference memory cell elements 301 to 304 may be the first direction D1. In this case, each state of the first to fourth reference memory cell elements 301 to 304 may be the second state.

Figure 33:
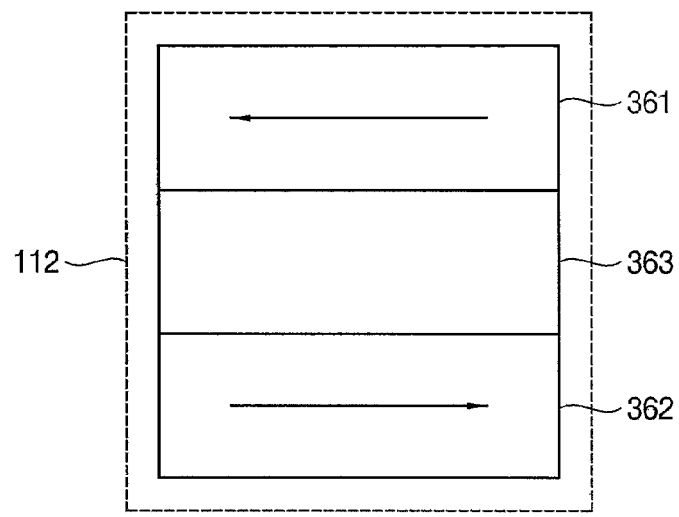
FIG. 33 is a diagram illustrating an example of a data memory cell included in a data region of the memory device of FIG. 30.
Figure 34:
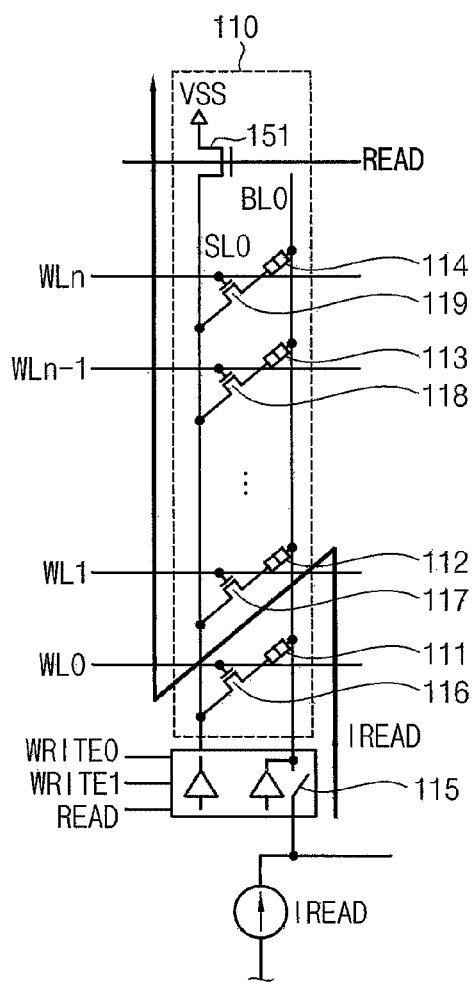
FIG. 34 is a diagram for describing an operation example of a data region of the memory device of FIG. 30 according to example embodiments.

FIG. 33 is a diagram illustrating an example of a data memory cell included in a data region of the memory device of FIG. 30, and FIG. 34 is a diagram for describing an operation example of a data region of the memory device of FIG. 30 according to example embodiments.

Referring to FIGS. 30 to 34, the reference region 300 provides the reference voltage VREF based on a resistance value of the resistor circuit 370 that is connected between the reference source line REF0SL and a reverse bias voltage line RV (hereinafter, which may be referred to as a reverse bias voltage RV, a negative voltage line, or a negative voltage). In example embodiments, the reverse bias voltage RV may be generated from a voltage generator (not shown) included in the memory device 10b. The second word line WL1 may be enabled to read the data of the second data memory cell element 112 included in the first data region 110.

In example embodiments, a data switch 115 for the first data region 110 may be turned on based on a read signal READ. For example, the read signal READ may activate when the memory device 10b is in a read operation and deactivate when the memory device 10b is in a write operation. When the data switch 115 for the first data region 110 is turned on based on the read signal READ, a read current IREAD may be provided to the first data region 110 along the first bit line BL0. When the second word line WL1 is enabled and the read current IREAD is provided to the first data region 110 along the first bit line BL0, the read current IREAD may be provided to the first source line SL0 through the second data memory cell element 112 and the second data cell transistor 117. When the read current IREAD is provided to the first source line SL0 through the second data memory cell element 112 and the second data cell transistor 117, the read current IREAD may be provided to the ground voltage VSS through a data transistor 151 of the first data region 110. For example, the voltage of the first bit line BL0 may be the data voltage DATA_V.

For example, in the reference region 300, a reference switch 305 may be turned on based on the read signal READ. When the reference switch 305 is turned on based on the read signal READ, the read current IREAD may be provided to the reference region 300 along the reference bit line REF0BL. When the second word line WL1 is enabled and the read current IREAD is provided to the reference region 300 along the reference bit line REF0BL, the read current IREAD may be provided to the reference source line REF0SL through the second reference memory cell element 302 and the second reference cell transistor 307. When the read current IREAD is provided to the reference source line REF0SL through the second reference memory cell element 302 and the second reference cell transistor 307, the read current IREAD may be provided to the reverse bias voltage RV through a reference transistor 351 and the resistor circuit 370. For example, the voltage of the reference bit line REF0BL may be the reference voltage VREF. The reverse bias voltage RV may be a negative voltage. The reverse bias voltage RV may be used so that the reference voltage VREF is less than the first reference voltage VREF1 corresponding to the data '1'. In addition, the read current IREAD may be controlled so that the reference voltage VREF is less than the first reference voltage VREF1 corresponding to the data '1'.

For example, the reference voltage VREF that is provided from the reference region 300 may be increased as the resistance value of the resistor circuit 370 is increased. For example, the reference voltage VREF that is provided from the reference region 300 may be decreased as the resistance value of the resistor circuit 370 is decreased. Therefore, when the resistance value of the resistor circuit 370 is controlled, the reference voltage VREF that is provided from the reference region 300 may be used to determine whether the data voltage DATA_V from each of the data regions 110, 120, 130, and 140 is a voltage corresponding to data '0' or a voltage corresponding to data '1'

The sense amplifier 500 provides an output data D_OUT by comparing the data voltage DATA_V and the reference voltage VREF. For example, the data that is stored in the second data memory cell element 112 included in the first data region 110 may be '1'. The second word line WL1 may be enabled to read the data of the second data memory cell element 112 included in the first data region 110. When the second word line WL1 is enabled and the read current IREAD is provided to the reference region 300 along the reference bit line REF0BL, the reference region 300 may provide the reference voltage VREF. When the second word line WL1 is enabled and the read current IREAD is provided to the first data region 110 along the first bit line BL0, the first data region 110 may provide the data voltage DATA_V corresponding to data '1'. For example, the sense amplifier 500 may provide the output data D_OUT by comparing the data voltage DATA_V corresponding to data '1' and the reference voltage VREF.

The memory device 10b according to example embodiments may increase the performance by providing the reference voltage VREF based on the resistance value of the resistor circuit 370 that is coupled between the reference source line REF0SL and the reverse bias voltage RV (e.g., the negative voltage).

The reference memory cell element may include a first layer 361, a second layer 362 and a third layer 363. The first layer 361 may be a free layer, the second layer 362 may be a pinned layer and the third layer 363 may be a tunnel layer or a barrier layer. In example embodiments, the state of the reference memory cell elements may be a second state where a spin direction of a first layer 361 included in the reference memory cell element is different from a spin direction of a second layer 362 included in the reference memory cell element.

For example, the second reference memory cell element 302 included in the reference region 300 of FIG. 30 may include the first layer 361, the second layer 362 and the third layer 363. The spin direction of the first layer 361 included in the second reference memory cell element 302 may be a second direction D2 and the spin direction of the second layer 362 included in the second reference memory cell element 302 may be the first direction D1. For example, the spin direction of the first layer 361 included in the second reference memory cell element 302 may be different from the spin direction of the second layer 362 included in the second reference memory cell element 302. When the spin direction of the first layer 361 included in the second reference memory cell element 302 is different from the spin direction of the second layer 362 included in the second reference memory cell element 302, the state of the second reference memory cell element 302 may be the second state.

For example, as described in FIG. 14, the third reference memory cell element 303 included in the reference region 300 may include the first layer 361, the second layer 362 and the third layer 363. The spin direction of the first layer 361 included in the third reference memory cell element 303 may be a first direction D1 and the spin direction of the second layer 362 included in the third reference memory cell element 303 may be the first direction D1. In this case, the spin direction of the first layer 361 included in the third reference memory cell element 303 may be equal to the spin direction of the second layer 362 included in the third reference memory cell element 303. When the spin direction of the first layer 361 included in the third reference memory cell element 303 is equal to the spin direction of the second layer 362 included in the third reference memory cell element 303, the state of the third reference memory cell element 303 may be the first state.

For example, the data memory cell element may include a first layer 361, a second layer 362 and a third layer 363. The first layer 361 may be the free layer, the second layer 362 may be the pinned layer and the third layer 363 may be the tunnel layer or the barrier layer. In example embodiments, a state of the data memory cell element may be a second state where a spin direction of a first layer 361 included in the data memory cell element is different from a spin direction of a second layer 362 included in the data memory cell element.

For example, the second data memory cell element 112 included in the first data region 110 may include the first layer 361, the second layer 362 and the third layer 363. The spin direction of the first layer 361 included in the second data memory cell element 112 may be the second direction D2 and the spin direction of the second layer 362 included in the second data memory cell element 112 may be the first direction D1. In this case, the spin direction of the first layer 361 included in the second data memory cell element 112 may be different from the spin direction of the second layer 362 included in the second data memory cell element 112. In case the spin direction of the first layer 361 included in the second data memory cell element 112 is different from the spin direction of the second layer 362 included in the second data memory cell element 112, the state of the second data memory cell element 112 may be the second state.

For example, as described in FIG. 16, the third data memory cell element 113 included in the first data region 110 may include the first layer 361, the second layer 362 and the third layer 363. The spin direction of the first layer 361 included in the third data memory cell element 113 may be a first direction D1 and the spin direction of the second layer 362 included in the third data memory cell element 113 may be the first direction D1. For example, the spin direction of the first layer 361 included in the third data memory cell element 113 may be equal to the spin direction of the second layer 362 included in the third data memory cell element 113. When the spin direction of the first layer 361 included in the third data memory cell element 113 is equal to the spin direction of the second layer 362 included in the third data memory cell element 113, the state of the third data memory cell element 113 may be the first state.

For example, the data '1' may be stored in the second data memory cell element 112 included in the first data region 110. The second word line WL1 may be enabled to read the data of the second data memory cell element 112 included in the first data region 110. For example, the data switch 115 for the first data region 110 may be turned on based on a read signal READ. When the data switch 115 for the first data region 110 is turned on based on the read signal READ, the read current IREAD may be provided to the first data region 110 along the first bit line BL0. When the second word line WL1 is enabled and the read current IREAD is provided to the first data region 110 along the first bit line BL0, the read current IREAD may be provided to the first source line SL0 through the second data memory cell element 112 and the second data cell transistor 117. When the read current IREAD is provided to the first source line SL0 through the second data memory cell element 112 and the second data cell transistor 117, the read current IREAD may be provided to the ground voltage VSS through a data transistor 151 of the first data region 110. For example, the voltage of the first bit line BL0 may be the data voltage DATA_V. The data voltage DATA_V may be a voltage corresponding to the data '1'.

In the reference region 300 of FIG. 30, a reference switch 305 may be turned on based on the read signal READ. When the reference switch 305 is turned on based on the read signal READ, the read current IREAD may be provided to the reference region 300 along the reference bit line REF0BL. When the second word line WL1 is enabled and the read current IREAD is provided to the reference region 300 along the reference bit line REF0BL, the read current IREAD may be provided to the reference source line REF0SL through the second reference memory cell element 302 and the second reference cell transistor 307. When the read current IREAD is provided to the reference source line REF0SL through the second reference memory cell element 302 and the second reference cell transistor 307, the read current IREAD may be provided to the reverse bias voltage RV through a reference transistor 351 and the resistor circuit 370. For example, the voltage of the reference bit line REF0BL may be the reference voltage VREF. The reference voltage VREF when the negative voltage is provided to one end of the resistor circuit 370 may be less than the reference voltage VREF when the ground voltage is provided to the one end of the resistor circuit 370.

For example, the data voltage DATA_V may be the voltage of the first bit line BL0. The reference voltage VREF may be the voltage of the reference bit line REF0BL. The reference region 300 may include the resistor circuit 370. When the resistance value of the resistor circuit 370 is greater than 0, the voltage drop may be generated by the read current IREAD that is transferred to the resistor circuit 370. When the voltage drop is generated by the read current IREAD that is transferred to the resistor circuit 370, the reference voltage VREF that is the voltage of the reference bit line REF0BL may be greater than the data voltage DATA_V (e.g., data '0') that is the voltage of the first bit line BL0. For example, the sense amplifier 500 may compare the data voltage DATA_V and the reference voltage VREF. When the reference voltage VREF is greater than the data voltage DATA_V (e.g., data '0'), the sense amplifier 500 may provide the output data D_OUT corresponding to data '0'. In addition, when the reference voltage VREF is less than the data voltage DATA_V (e.g., data '1'), the sense amplifier 500 may provide the output data D_OUT corresponding to data '1'

The memory device 10b according to example embodiments may increase the performance by providing the reference voltage VREF based on the resistance value of the resistor circuit 370 that is connected between the reference source line REF0SL and the negative voltage.

Each of the reference memory cell elements 301 to 304 may include a first layer 361, a second layer 362 and a third layer 363. The first layer 361 may be a free layer, the second layer 362 may be a pinned layer and the third layer 363 may be a tunnel layer or a barrier layer. In an example embodiment, a state of each of the reference memory cell elements may be a second state where a spin direction of a first layer 361 included in each of the reference memory cell elements is different from a spin direction of a second layer 362 included in each of the reference memory cell elements.

For example, the second reference memory cell element 302 included in the reference region 300 may include the first layer 361, the second layer 362 and the third layer 363. The spin direction of the first layer 361 included in the second reference memory cell element 302 may be the second direction D2 and the spin direction of the second layer 362 included in the second reference memory cell element 302 may be the first direction D1. For example, the spin direction of the first layer 361 included in the second reference memory cell element 302 may be different from the spin direction of the second layer 362 included in the second reference memory cell element 302. When the spin direction of the first layer 361 included in the second reference memory cell element 302 is different from the spin direction of the second layer 362 included in the second reference memory cell element 302, the state of the second reference memory cell element 302 may be the second state.

For example, as described in FIG. 14, the third reference memory cell element 303 included in the reference region 300 may include the first layer 361, the second layer 362 and the third layer 363. The spin direction of the first layer 361 included in the third reference memory cell element 303 may be a first direction D1 and the spin direction of the second layer 362 included in the third reference memory cell element 303 may be the first direction D1. In this case, the spin direction of the first layer 361 included in the third reference memory cell element 303 may be equal to the spin direction of the second layer 362 included in the third reference memory cell element 303. When the spin direction of the first layer 361 included in the third reference memory cell element 303 is equal to the spin direction of the second layer 362 included in the third reference memory cell element 303, the state of the third reference memory cell element 303 may be the first state.

For example, the data memory cell element may include a first layer 361, a second layer 362 and a third layer 363. The first layer 361 may be the free layer, the second layer 362 may be the pinned layer and the third layer 363 may be the tunnel layer or the barrier layer. In example embodiments, a state of the data memory cell element may be a second state where a spin direction of a first layer 361 included in the data memory cell is different from a spin direction of a second layer 362 included in the data memory cell element.

For example, the second data memory cell element 112 included in the first data region 110 may include the first layer 361, the second layer 362 and the third layer 363. The spin direction of the first layer 361 included in the second data memory cell element 112 may be the second direction D2 and the spin direction of the second layer 362 included in the second data memory cell element 112 may be the first direction D1. For example, the spin direction of the first layer 361 included in the second data memory cell element 112 may be different from the spin direction of the second layer 362 included in the second data memory cell element 112. When the spin direction of the first layer 361 included in the second data memory cell element 112 is different from the spin direction of the second layer 362 included in the second data memory cell element 112, the state of the second data memory cell element 112 may be the second state.

For example, as described in FIG. 16, the third data memory cell element 113 included in the first data region 110 may include the first layer 361, the second layer 362 and the third layer 363. The spin direction of the first layer 361 included in the third data memory cell element 113 may be a first direction D1 and the spin direction of the second layer 362 included in the third data memory cell element 113 may be the first direction D1. For example, the spin direction of the first layer 361 included in the third data memory cell element 113 may be equal to the spin direction of the second layer 362 included in the third data memory cell element 113. When the spin direction of the first layer 361 included in the third data memory cell element 113 is equal to the spin direction of the second layer 362 included in the third data memory cell element 113, the state of the third data memory cell element 113 may be the first state.

In example embodiments, the data '1' may be stored in the second data memory cell element 112 included in the first data region 110. The second word line WL1 may be enabled to read the data of the second data memory cell element 112 included in the first data region 110. For example, the data switch 115 for the first data region 110 may be turned on based on a read signal READ. When the data switch 115 for the first data region 110 is turned on based on the read signal READ, the read current IREAD may be provided to the first data region 110 along the first bit line BL0. When the second word line WL1 is enabled and the read current IREAD is provided to the first data region 110 along the first bit line BL0, the read current IREAD may be provided to the first source line SL0 through the second data memory cell element 112 and the second data cell transistor 117. When the read current IREAD is provided to the first source line SL0 through the second data memory cell element 112 and the second data cell transistor 117, the read current IREAD may be provided to the ground voltage VSS through a data transistor 151 of the first data region 110. For example, the voltage of the first bit line BL0 may be the data voltage DATA_V. The data voltage DATA_V may be a voltage corresponding to the data '1'.

For example, in the reference region 300, a reference switch 305 may be turned on based on the read signal READ. When the reference switch 305 is turned on based on the read signal READ, the read current IREAD may be provided to the reference region 300 along the reference bit line REF0BL. When the second word line WL1 is enabled and the read current IREAD is provided to the reference region 300 along the reference bit line REF0BL, the read current IREAD may be provided to the reference source line REF0SL through the second reference memory cell element 302 and the second reference cell transistor 307. When the read current IREAD is provided to the reference source line REF0SL through the second reference memory cell element 302 and the second reference cell transistor 307, the read current IREAD may be provided to the reverse bias voltage RV through a reference transistor 351 and the resistor circuit 370. For example, the voltage of the reference bit line REF0BL may be the reference voltage VREF.

For example, the data voltage DATA_V may be the voltage of the first bit line BL0. The reference voltage VREF may be the voltage of the reference bit line REF0BL. The reference region 300 may include the resistor circuit 370. When the resistance value of the resistor circuit 370 is greater than 0, the voltage drop may be generated by the read current IREAD that is transferred to the resistor circuit 370. When the voltage drop is generated by the read current IREAD that is transferred to the resistor circuit 370, the reference voltage VREF that is the voltage of the reference bit line REF0BL may be greater than the data voltage DATA_V that is the voltage of the first bit line BL0. For example, the sense amplifier 500 may compare the data voltage DATA_V (e.g., data '0') and the reference voltage VREF. When the reference voltage VREF is greater than the data voltage DATA_V, the sense amplifier 500 may provide the output data D_OUT corresponding to data '0'. In addition, when the reference voltage VREF is less than the data voltage DATA_V (e.g., data '1'), the sense amplifier 500 may provide the output data D_OUT corresponding to data '1'.

The memory device 10b according to example embodiments may increase the performance by providing the reference voltage VREF based on the resistance value of the resistor circuit 370 that is connected between the reference source line REF0SL and the negative voltage.

In example embodiments, the reference region 300 may include a reference transistor 351 connecting between the reference source line REF0SL and the resistor circuit 370. Each of the data regions 110, 120, 130, and 140 may include a data transistor connecting between the source lines and a ground voltage VSS. The reference transistor 351 and the respective data transistors may be turned on based on a read signal READ.

In example embodiments, when the read signal READ is a first logic level, the reference transistor 351 may be turned off. When the reference transistor 351 is turned off, providing the signal of the reference source line REF0SL to the resistor circuit 370 through the reference transistor 351 may be blocked. When the read signal READ is a second logic level, the reference transistor 351 may be turned on. When the reference transistor 351 is turned on, the signal of the reference source line REF0SL may be transferred to the resistor circuit 370 through the reference transistor 351. For example, the reference transistor 351 may be turned on during the read operation of the memory device 10b. When the reference transistor 351 is turned on during the read operation of the memory device 10b, the read current IREAD that is provided to the reference source line REF0SL may be transferred to the resistor circuit 370 through the reference transistor 351.

For example, the data transistors may include a first data transistor 151, a second data transistor 152, a third data transistor 153 and a fourth data transistor 154. The first data transistor 151 may included in the first data region 110, the second data transistor 152 may included in the second data region 120, the third data transistor 153 may included in the third data region 130 and the fourth data transistor 154 may included in the fourth data region 140. For example, in case the read signal READ is a first logic level, the first data transistor 151 may be turned off. When the first data transistor 151 is turned off, providing the signal of the first source line SL0 to the ground voltage VSS through the first data transistor 151 may be blocked. When the read signal READ is the second logic level, the first data transistor 151 may be turned on. When the first data transistor 151 is turned on, the signal of the first source line SL0 may be transferred to the ground voltage VSS through the first data transistor 151. For example, the first data transistor 151 may be turned on during the read operation of the memory device 10b. When the first data transistor 151 is turned on during the read operation of the memory device 10b, the read current IREAD that is provided to the first source line SL0 may be transferred to the ground voltage VSS through the first data transistor 151.

When the read signal READ is the first logic level, the second data transistor 152 may be turned off. When the second data transistor 152 is turned off, providing the signal of the second source line SL1 to the ground voltage VSS through the second data transistor 152 may be blocked. When the read signal READ is the second logic level, the second data transistor 152 may be turned on. When the second data transistor 152 is turned on, the signal of the second source line SL1 may be transferred to the ground voltage VSS through the second data transistor 152. For example, the second data transistor 152 may be turned on during the read operation of the memory device 10b. When the second data transistor 152 is turned on during the read operation of the memory device 10b, the read current IREAD that is provided to the second source line SL1 may be transferred to the ground voltage VSS through the second data transistor 152. When the read signal READ is the first logic level, the third data transistor 153 may be turned off. When the third data transistor 153 is turned off, providing the signal of the third source line SL2 to the ground voltage VSS through the third data transistor 153 may be blocked. When the read signal READ is the second logic level, the third data transistor 153 may be turned on. In case the third data transistor 153 is turned on, the signal of the third source line SL2 may be transferred to the ground voltage VSS through the third data transistor 153. For example, the third data transistor 153 may be turned on during the read operation of the memory device 10b. In case the third data transistor 153 is turned on during the read operation of the memory device 10b, the read current IREAD that is provided to the third source line SL2 may be transferred to the ground voltage VSS through the third data transistor 153.

When the read signal READ is the first logic level, the fourth data transistor 154 may be turned off. When the fourth data transistor 154 is turned off, providing the signal of the fourth source line SLn to the ground voltage VSS through the fourth data transistor 154 may be blocked. When the read signal READ is the second logic level, the fourth data transistor 154 may be turned on. When the fourth data transistor 154 is turned on, the signal of the fourth source line SLn may be transferred to the ground voltage VSS through the fourth data transistor 154. For example, the fourth data transistor 154 may be turned on during the read operation of the memory device 10b. When the fourth data transistor 154 is turned on during the read operation of the memory device 10b, the read current IREAD that is provided to the fourth source line SLn may be transferred to the ground voltage VSS through the fourth data transistor 154.

In example embodiments, the resistor circuit 370 may be connected between the reference transistor 351 and a reverse bias voltage RV. For example, a voltage of the reference bit line REF0BL may be controlled according to the reverse bias voltage RV and a resistance value of the resistor circuit 370.

The second word line WL1 may be enabled to read the data of the second data memory cell element 112 included in the first data region 110. For example, in the reference region 300, a reference switch 305 may be turned on based on the read signal READ. When the reference switch 305 is turned on based on the read signal READ, the read current IREAD may be provided to the reference region 300 along the reference bit line REF0BL. When the second word line WL1 is enabled and the read current IREAD is provided to the reference region 300 along the reference bit line REF0BL, the read current IREAD may be provided to the reference source line REF0SL through the second reference memory cell element 302 and the second reference cell transistor 307. When the read current IREAD is provided to the reference source line REF0SL through the second reference memory cell element 302 and the second reference cell transistor 307, the read current IREAD may be provided to the reverse bias voltage RV through a reference transistor 351 and the resistor circuit 370. For example, the voltage of the reference bit line REF0BL may be the reference voltage VREF. The reference transistor 351 may be a NMOS transistor. For example, the voltage of the reference bit line REF0BL may be decreased as the reverse bias voltage RV is decreased (e.g., an absolute value of a negative voltage is increased). In addition, the voltage of the reference bit line REF0BL may be increased as the reverse bias voltage RV is increased (e.g., an absolute value of a negative voltage is decreased). The reverse bias voltage RV may be a negative voltage.

In example embodiments, the voltage of the reference bit line REF0BL may be controlled according to the read current IREAD. For example, the voltage of the reference bit line REF0BL may be decreased as the read current IREAD is decreased and the voltage of the reference bit line REF0BL may be increased as the read current IREAD is increased.

Figure 35:
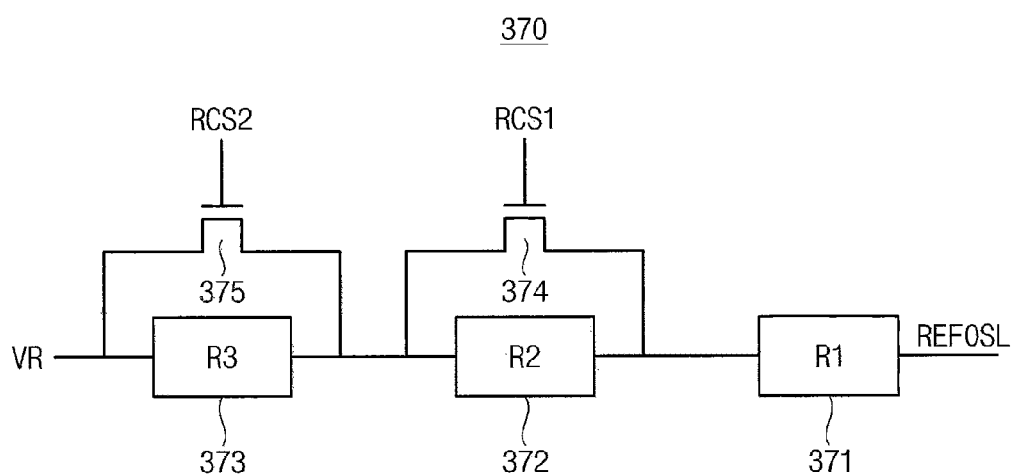
FIG. 35 is a diagram illustrating an example of a resistor circuit included in the memory device of FIG. 30 according to example embodiments.

FIG. 35 is a diagram illustrating an example of a resistor circuit included in the memory device of FIG. 30 according to example embodiments.

Referring to FIGS. 30 and 35, the resistor circuit 370 may include a first resistor 371, a second resistor 372, a third resistor 373, a first resistor transistor 374 and a second resistor transistor 375. In example embodiments, the resistor circuit 370 may be connected between the reference transistor 351 and the reverse bias voltage RV. For example, the resistor circuit 370 may include the first, second, and third resistors 371, 372, and 373 connected in series, and the first and second resistor transistors 374 and 375 connected in parallel to the second and third resistors 372 and 373, respectively. First and second resistor control signals RCS1 and RCS2 may control the first and second resistor transistors 374 and 375.

A voltage of the reference bit line REF0BL may be changed based on a resistance value of the resistor circuit 370. For example, the first resistor control signal RCS1 may be transferred to the gate of the first resistor transistor 374 and the second resistor control signal RCS2 may be transferred to the gate of the second resistor transistor 375. When the first resistor control signal RCS1 is a first logic level, the first resistor transistor 374 may be turned off. In addition, in case the first resistor control signal RCS1 is a second logic level, the first resistor transistor 374 may be turned on. The first logic level may be a logic low level and the second logic level may be a logic high level. When the second resistor control signal RCS2 is the first logic level, the second resistor transistor 375 may be turned off and when the second resistor control signal RCS2 is the second logic level, the second resistor transistor 375 may be turned on.

For example, when the first resistor control signal RCS1 and the second resistor control signal RCS2 are the first logic level, the resistance value of the resistor circuit 370 is R1+R2+R3. When the first resistor control signal RCS1 is the second logic level and the second resistor control signal RCS2 is the first logic level, the resistance value of the resistor circuit 370 is R1+R3. When the first resistor control signal RCS1 is the second logic level and the second resistor control signal RCS2 is the second logic level, the resistance value of the resistor circuit 370 is R1. Therefore, the resistance value of the resistor circuit 370 may be changed according to the first resistor control signal RCS1 and the second resistor control signal RCS2. The first resistor control signal RCS1 and the second resistor control signal RCS2 may be provided from the control logic circuit.

In example embodiments, a third resistor transistor 376 (not shown) may be connected to the first resistor 371 in parallel and a third resistor control signal RCS3 (not shown) may control the third resistor transistor 376. For example, the resistance value of the resistor circuit 370 is '0' when the resistor transistors 374, 375, and 376 are turned on.

In example embodiments, the voltage of the reference bit line REF0BL may be increased as the resistance value of the resistor circuit 370 is increased and the voltage of the reference bit line REF0BL may be decreased as the resistance value of the resistor circuit 370 is decreased. For example, the second word line WL1 may be enabled to read the data of the second data memory cell element 112 included in the first data region 110. For example, in the reference region 300, a reference switch 305 may be turned on based on the read signal READ. When the reference switch 305 is turned on based on the read signal READ, the read current IREAD may be provided to the reference region 300 along the reference bit line REF0BL. When the second word line WL1 is enabled and the read current IREAD is provided to the reference region 300 along the reference bit line REF0BL, the read current IREAD may be provided to the reference source line REF0SL through the second reference memory cell element 302 and the second reference cell transistor 307. When the read current IREAD is provided to the reference source line REF0SL through the second reference memory cell element 302 and the second reference cell transistor 307, the read current IREAD may be provided to the reverse bias voltage RV through a reference transistor 351 and the resistor circuit 370. For example, the voltage of the reference bit line REF0BL may be the reference voltage VREF. The reference transistor 351 may be a NMOS transistor.

The reference voltage VREF that is provided from the reference region 300 may be increased as the resistance value of the resistor circuit 370 is increased. In addition, the reference voltage VREF that is provided from the reference region 300 may be decreased as the resistance value of the resistor circuit 370 is decreased. Therefore, when the resistance value of the resistor circuit 370 is controlled, the reference voltage VREF that is provided from the reference region 300 may be used to determine whether the data voltage DATA_V from each of the data regions 110, 120, 130, and 140 is a voltage corresponding to data '0' or a voltage corresponding to data '1'.

In example embodiments, the memory device 10b may control the resistance value of the resistor circuit 370 based on one or more resistor control signals. For example, when the resistor control signal is a first logic level, the resistance value of the resistor circuit 370 may be increased. In addition, when the resistor control signal is a second logic level, the resistance value of the resistor circuit 370 may be decreased.

Figure 36:
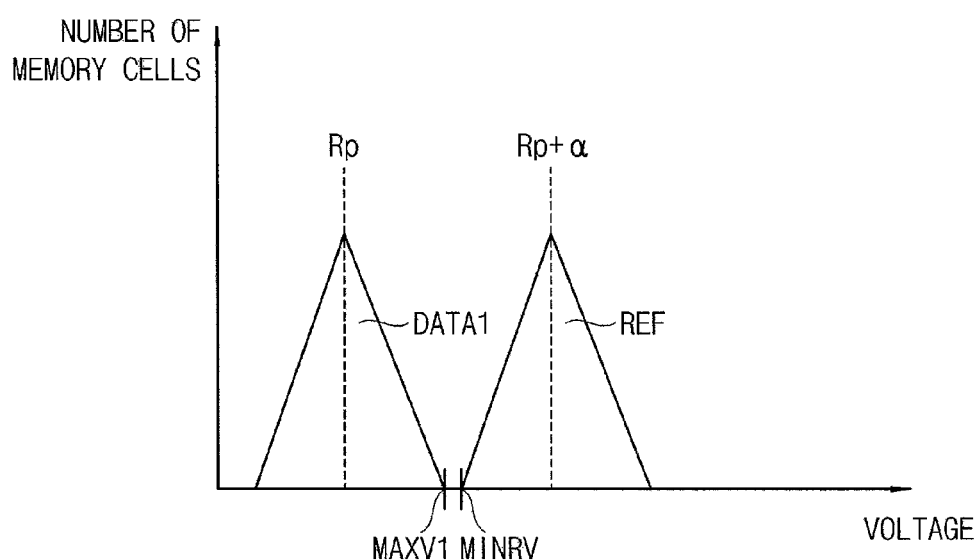
FIG. 36 is a diagram illustrating a voltage distribution of reference memory cells and a voltage distribution of a first set of data memory cells when first data is stored in the first set of data memory cells according to example embodiments.

FIG. 36 is a diagram illustrating a voltage distribution of reference memory cells and a voltage distribution of a first set of data memory cells when first data is stored in the first set of data memory cells according to example embodiments.

Referring to FIGS. 30 and 36, the reference memory cells may include the first to fourth reference memory cell elements 301 to 304. A minimum value in a voltage distribution of the first to fourth reference memory cell elements 301 to 304 may be the reference minimum voltage MINRV. The first set of memory cells that have first data DATA1 among the data memory cells may include the first to fourth data memory cell elements 111 to 114. For example, each of the first to fourth data memory cell elements 111 to 114 may have the first data DATA1. A maximum value in a voltage distribution of the first to fourth data memory cell elements 111 to 114 may be a first data maximum voltage MAXV1. In example embodiments, the reference minimum voltage MINRV may be greater than the first data maximum voltage MAXV1. The reference minimum voltage MINRV may be a minimum value in a voltage distribution of the reference memory cells. The first data maximum voltage MAXV1 may be a maximum value in a voltage distribution of the first set of data memory cells that have the first data DATA1 among the data memory cells. The first data DATA1 may be the data '0'. However, the first data DATA1 may be the data '1'.

Figure 37:
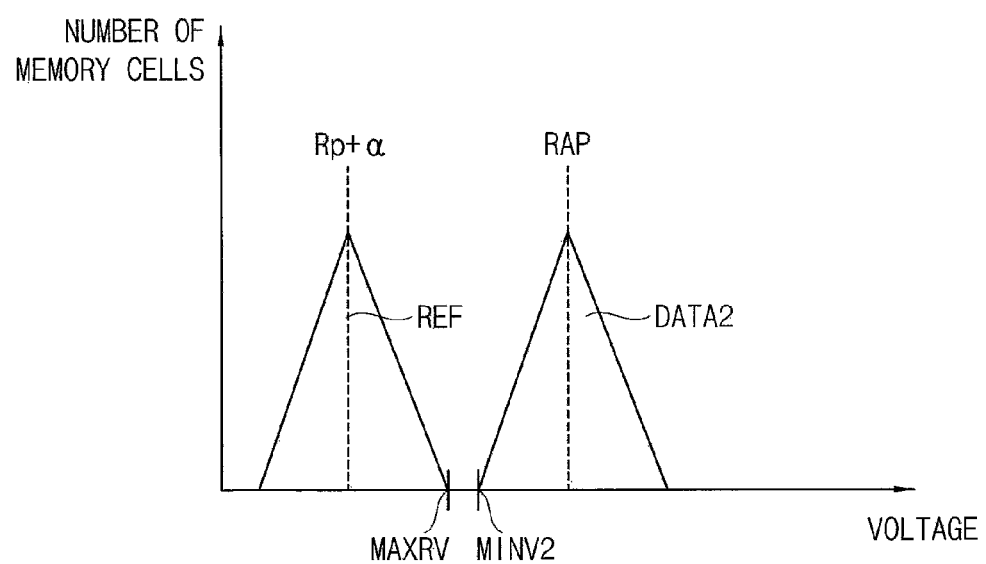
FIG. 37 is a diagram illustrating a voltage distribution of reference memory cells and a voltage distribution of a second set of data memory cells when second data is stored in the second set of data memory cells according to example embodiments.

FIG. 37 is a diagram illustrating a voltage distribution of reference memory cells and a voltage distribution of a second set of data memory cells when second data is stored in the second set of data memory cells according to example embodiments.

Referring to FIGS. 30 and 37, the reference memory cells may include the first to fourth reference memory cell elements 301 to 304. A maximum value in a voltage distribution of the first to fourth reference memory cell elements 301 to 304 may be the reference maximum voltage MAXRV. The second set of data memory cells that have the second data DATA2 among the data memory cells may include the fifth to eighth data memory cell elements 121 to 124. For example, each of the fifth to eighth data memory cell elements 121 to 124 may have the second data DATA2. A minimum value in a voltage distribution of the fifth to eighth data memory cell elements 121 to 124 may be a second data minimum voltage MINV2. In example embodiments, the reference maximum voltage MAXRV may be less than the second data minimum voltage MINV2. The reference maximum voltage MAXRV may be a maximum value in a voltage distribution of the reference memory cells. The second data minimum voltage MINV2 may be a minimum value in a voltage distribution of the second set of data memory cells that have the second data DATA2 among the data memory cells. The second data DATA2 may be the data '1'. However, the second data DATA2 may be the data '0'.

Figure 38:
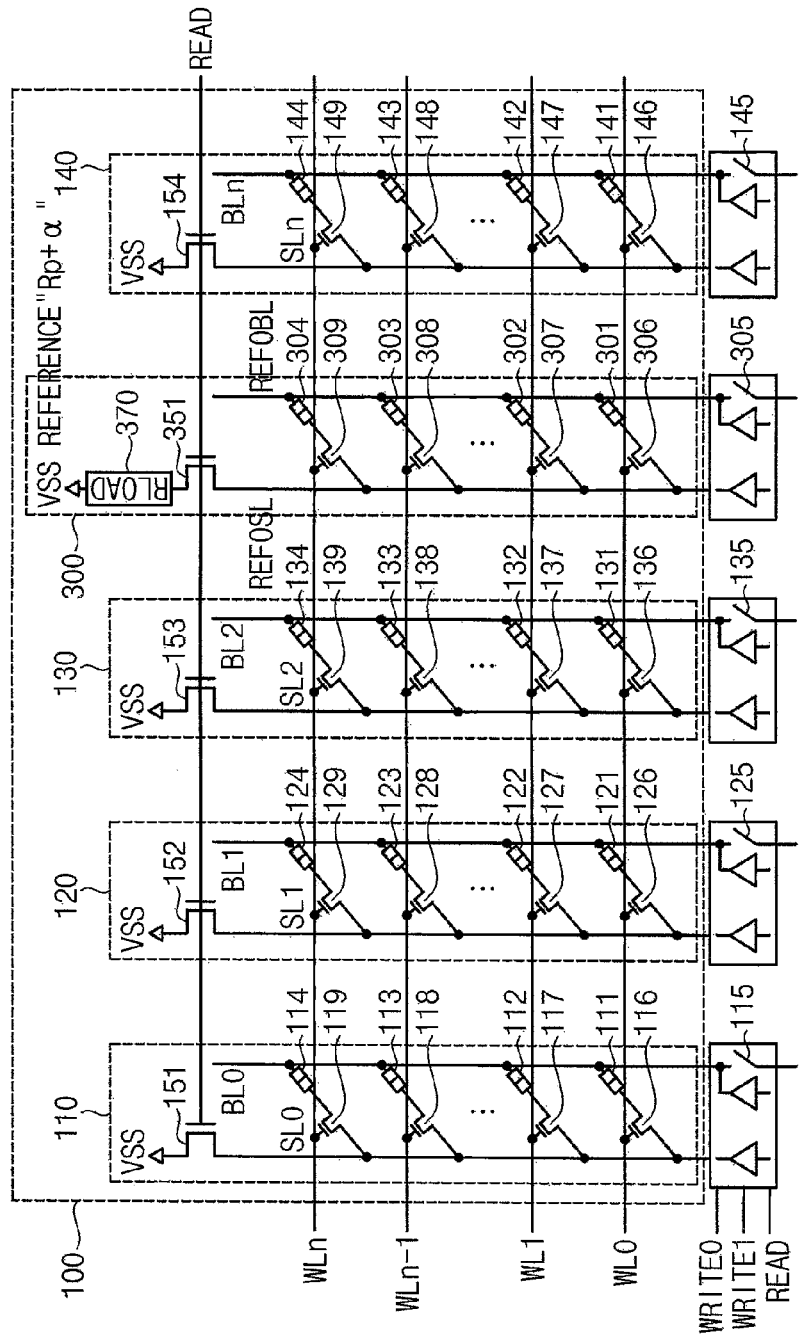
FIG. 38 is a diagram illustrating a memory cell array according to example embodiments.

FIG. 38 is a diagram illustrating a memory cell array according to example embodiments.

Referring to FIG. 38, the memory cell array 100 includes data regions 110, 120, 130, and 140 and a reference region 300. Each of the data regions 110, 120, 130, and 140 provides a data voltage DATA_V corresponding to data stored in data memory cells. Each of the data region 110, 120, 130, and 140 may include a plurality of data memory cells that are disposed between bit lines and source lines. For example, the data regions 110, 120, 130, and 140 may include a first data region 110, a second data region 120, a third data region 130 and a fourth data region 140. The first data region 110 may include the first to fourth data memory cell elements 111 to 114 and data cell transistors 116 to 119 that are disposed between a first bit line BL0 and a first source line SL0. The second data region 120 may include a fifth to eighth data memory cell elements 121 to 124 and data cell transistors 126 to 129 that are disposed between a second bit line BL1 and a second source line SL1. The third data region 130 may include a ninth to twelfth data memory cell elements 131 to 134 and data cell transistors 136 to 139 that are disposed between a third bit line BL2 and a third source line SL2. The fourth data region 140 may include a thirteenth to sixteenth data memory cell elements 141 to 144 and data cell transistors 146 to 149 that are disposed between a fourth bit line BLn and a fourth source line SLn.

The reference region 300 may include a plurality of reference memory cells that are disposed between a reference bit line REF0BL and a reference source line REF0SL. For example, the plurality of reference memory cells may include the first to fourth reference memory cell elements 301 to 304 and reference cell transistors 306 to 309 that are between the reference bit line REF0BL and the reference source line REF0SL. As described in FIG. 14, the state of each of the first to fourth reference memory cell elements 301 to 304 may be a first state where a spin direction of a first layer 361 included in each of the first to fourth reference memory cell elements 301 to 304 is equal to a spin direction of a second layer 362 included in the first to fourth reference memory cell elements 301 to 304. For example, the spin direction of the first layer 361 and the second layer 362 included in each of the first to fourth reference memory cell elements 301 to 304 may be a first direction D1.

The reference region 300 provides a reference voltage VREF based on a resistance value of a resistor circuit 370 that is connected between the reference source line REF0SL and the reverse bias voltage RV (e.g., a negative voltage). For example, a third word line WLn−1 may be enabled to read the data of a third data memory cell element 113 included in the first data region 110.

In example embodiments, a data switch 151 for the first data region 110 may be turned on based on a read signal READ. When the data switch 151 for the first data region 110 is turned on based on the read signal READ, a read current IREAD may be provided to the first data region 110 along the first bit line BL0. When the third word line WLn−1 is enabled and the read current IREAD is provided to the first data region 110 along the first bit line BL0, the read current IREAD may be provided to the first source line SL0 through the third data memory cell element 113 and the third data cell transistor 118. When the read current IREAD is provided to the first source line SL0 through the third data memory cell element 113 and the third data cell transistor 118, the read current IREAD may be provided to the ground voltage VSS through a data transistor 151 of the first data region 110. For example, the voltage of the first bit line BL0 may be the data voltage DATA_V.

In example embodiments, in the reference region 300, a reference switch 305 may be turned on based on the read signal READ. When the reference switch 305 is turned on based on the read signal READ, the read current IREAD may be provided to the reference region 300 along the reference bit line REF0BL. In case the third word line WLn−1 is enabled and the read current IREAD is provided to the reference region 300 along the reference bit line REF0BL, the read current IREAD may be provided to the reference source line REF0SL through the third reference memory cell element 303 and the third reference cell transistor 308. When the read current IREAD is provided to the reference source line REF0SL through the third reference memory cell element 303 and the third reference cell transistor 308, the read current IREAD may be provided to the reverse bias voltage RV through a reference transistor 351 and the resistor circuit 370. For example, the voltage of the reference bit line REF0BL may be the reference voltage VREF.

In example embodiments, when the resistance value of the resistor circuit 370 is 0, the reference voltage VREF that is provided from the reference region 300 may be a reference voltage VREF corresponding to data '0'. The reference voltage VREF that is provided from the reference region 300 may be increased as the resistance value of the resistor circuit 370 is increased. In addition, the reference voltage VREF that is provided from the reference region 300 may be decreased as the resistance value of the resistor circuit 370 is decreased. Therefore, when the resistance value of the resistor circuit 370 is controlled, the reference voltage VREF that is provided from the reference region 300 may be used to determine whether the data voltage DATA_V from each of the data regions 110, 120, 130, and 140 is a voltage corresponding to data '0' or a voltage corresponding to data '1'.

In example embodiments, a memory cell array 100 may be a three-dimensional memory cell array 100. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference in their entirety, describe suitable configurations for the 3D memory arrays, in which the three-dimensional memory array is configured as a plurality of levels, with word-lines WL and/or bit-lines BL shared between levels: U.S. Pat. Nos. 7,679,133; 8,553,466; 8,654,587; and 8,559,235; and U.S. Pat. Pub. No. 2011/0233648.

Figure 39:
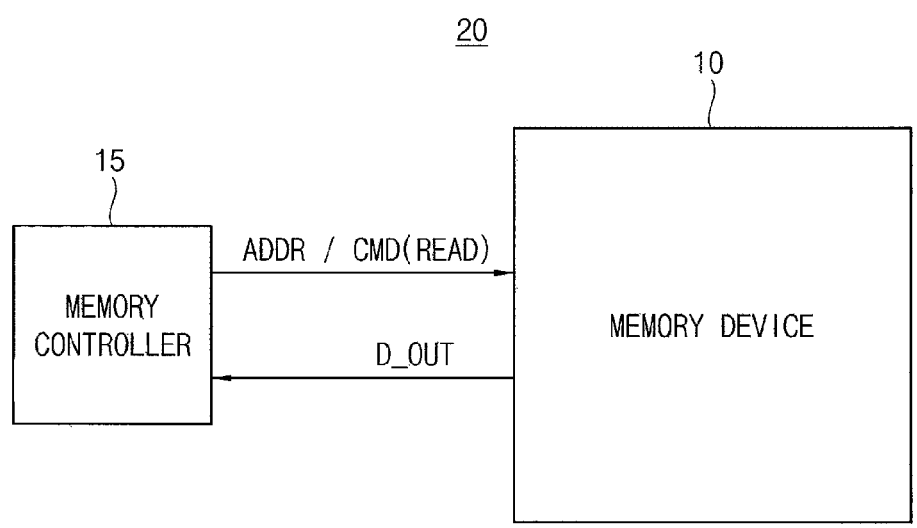
FIG. 39 is a diagram illustrating a memory system according to example embodiments.

FIG. 39 is a diagram illustrating a memory system according to example embodiments.

Referring to FIGS. 1 and 39, a memory system 20 includes a memory controller 15 and a memory device 10 disclosed herein. The memory controller 15 provides an access address signal ADDR and a command signal CMD (e.g., a read signal READ). The memory device 10 provides an output data D_OUT based on the access address signal ADDR and the read signal READ.

The memory device 10 includes a memory cell array 100 and a sense amplifier 500. The memory cell array 100 may include data regions 110, 120, 130, and 140 and a reference region 300. Each of the data regions 110, 120, 130, and 140 provides a data voltage DATA_V corresponding to data stored in data memory cells. Each of the data regions 110, 120, 130, and 140 includes a plurality of data memory cells that are disposed between bit lines and source lines. For example, the data regions 110, 120, 130, and 140 may include a first data region 110, a second data region 120, a third data region 130 and a fourth data region 140. The first data region 110 may include the first to fourth data memory cell elements 111 to 114 and data cell transistors 116 to 119 that are disposed between a first bit line BL0 and a first source line SL0. The second data region 120 may include a fifth to eighth data memory cell elements 121 to 124 and data cell transistors 126 to 129 that are disposed between a second bit line BL1 and a second source line SL1. The third data region 130 may include a ninth to twelfth data memory cell elements 131 to 134 and data cell transistors 136 to 139 that are disposed between a third bit line BL2 and a third source line SL2. The fourth data region 140 may include a thirteenth to sixteenth data memory cell elements 141 to 144 and data cell transistors 146 to 149 that are disposed between a fourth bit line BLn and a fourth source line SLn.

The reference region 300 includes a plurality of reference memory cells that are disposed between a reference bit line REF0BL and the reference source line REF0SL. For example, the plurality of reference memory cells may include the first to fourth reference memory cell elements 301 to 304 and reference transistors 306 to 309 that are disposed between the reference bit line REF0BL and the reference source line REF0SL. As will be described in FIG. 14, the state of each of the first to fourth reference memory cell elements 301 to 304 may be a first state where a spin direction of a first layer 361 included in the first to fourth reference memory cell elements 301 to 304 is equal to a spin direction of a second layer 362 included in the first to fourth reference memory cell elements 301 to 304. For example, the spin direction of the first layer 361 and the second layer 362 included in each of the first to fourth reference memory cell elements 301 to 304 may be a first direction D1.

The reference region 300 provides a reference voltage VREF based on a resistance value of a resistor circuit 370 that is connected between the reference source line REF0SL and a reverse bias voltage RV (e.g., a negative voltage). For example, a third word line WLn−1 may be enabled to read the data of a third data memory cell element 113 included in the first data region 110.

In example embodiments, a data switch 115 for the first data region 110 may be turned on based on a read signal READ. When the data switch 115 for the first data region 110 is turned on based on the read signal READ, the read current IREAD may be provided to the first data region 110 along the first bit line BL0. In case the third word line WLn−1 is enabled and the read current IREAD is provided to the first data region 110 along the first bit line BL0, the read current IREAD may be provided to the first source line SL0 through the third data memory cell element 113 and the third data cell transistor 118. When the read current IREAD is provided to the first source line SL0 through the third data memory cell element 113 and the third data cell transistor 118, the read current IREAD may be provided to the reverse bias voltage RV through a data transistor 151 of the first data region 110. For example, the voltage of the first bit line BL0 may be the data voltage DATA_V.

In example embodiments, in the reference region 300, a reference switch 305 may be turned on based on the read signal READ. When the reference switch 305 is turned on based on the read signal READ, the read current IREAD may be provided to the reference region 300 along the reference bit line REF0BL. When the third word line WLn−1 is enabled and the read current IREAD is provided to the reference region 300 along the reference bit line REF0BL, the read current IREAD may be provided to the reference source line REF0SL through the third reference memory cell element 303 and the third reference cell transistor 308. When the read current IREAD is provided to the reference source line REF0SL through the third reference memory cell element 303 and the third reference cell transistor 308, the read current IREAD may be provided to the ground voltage VSS through a reference transistor 351 and the resistor circuit 370. For example, the voltage of the reference bit line REF0BL may be the reference voltage VREF.

In certain embodiments, when the resistance value of the resistor circuit 370 is 0, the reference voltage VREF that is provided from the reference region 300 may be a reference voltage VREF corresponding to data '0'. The reference voltage VREF that is provided from the reference region 300 may be increased as the resistance value of the resistor circuit 370 is increased. In addition, the reference voltage VREF that is provided from the reference region 300 may be decreased as the resistance of the resistor circuit 370 is decreased. Therefore, when the resistance value of the resistor circuit 370 is controlled, the reference voltage VREF that is provided from the reference region 300 may be used to determine whether the data voltage DATA_V from each of the data regions 110, 120, 130, and 140 is a voltage corresponding to data '0' or a voltage corresponding to data '1'.

The sense amplifier 500 provides an output data D_OUT by comparing the data voltage DATA_V and the reference voltage VREF. For example, the data that is stored in the third data memory cell element 113 included in the first data region 110 may be '1'. The third word line WLn−1 may be enabled to read the data of the third data memory cell element 113 included in the first data region 110. When the third word line WLn−1 is enabled and the read current IREAD is provided to the reference region 300 along the reference bit line REF0BL, the reference region 300 may provide the reference voltage VREF. In addition, when the third word line WLn−1 is enabled and the read current IREAD is provided to the first data region 110 along the first bit line BL0, the first data region 110 may provide the data voltage DATA_V corresponding to data '1'. For example, the sense amplifier 500 may provide the output data D_OUT by comparing the data voltage DATA_V corresponding to data '1' and the reference voltage VREF.

The memory device 10b according to example embodiments may increase the performance by providing the reference voltage VREF based on the resistance value of the resistor circuit 370 that is connected to the reference source line REF0SL and the reverse bias voltage RV.

Figure 40:
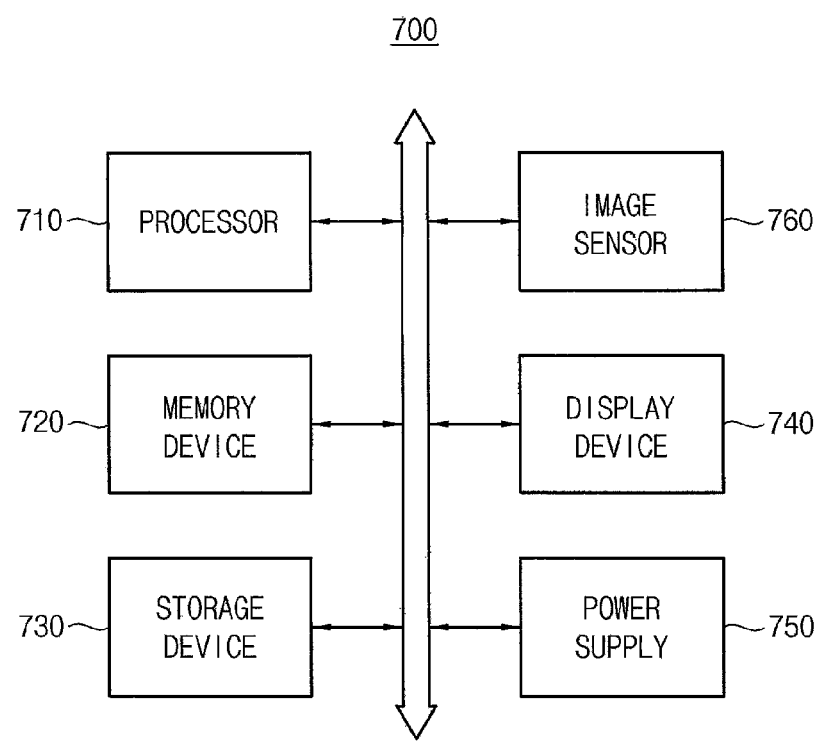
FIG. 40 is a block diagram illustrating a computing system including a memory device according to example embodiments.

FIG. 40 is a block diagram illustrating a mobile device including the memory module according to example embodiments.

Referring to FIG. 40, a computing system 700 may include a processor 710, a memory device 720 disclosed herein, a storage device 730, a display device 740, a power supply 750 and an image sensor 760. The computing system 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the computing system 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to example embodiments. The storage device 730 may include a solid state drive (SSD), a hard disk drive (HDD), a CD-ROM, etc. The computing system 700 may further include an input device such as a touchscreen, a keyboard, a keypad, a mouse, etc., and an output device such as a printer, a display device, etc. The power supply 750 supplies operation voltages for the computing system 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the computing system 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 700 may be a digital camera, a mobile phone, a smart phone, a portable multimedia player (PMP), a personal digital assistant (PDA), a computer, etc.

Figure 41:
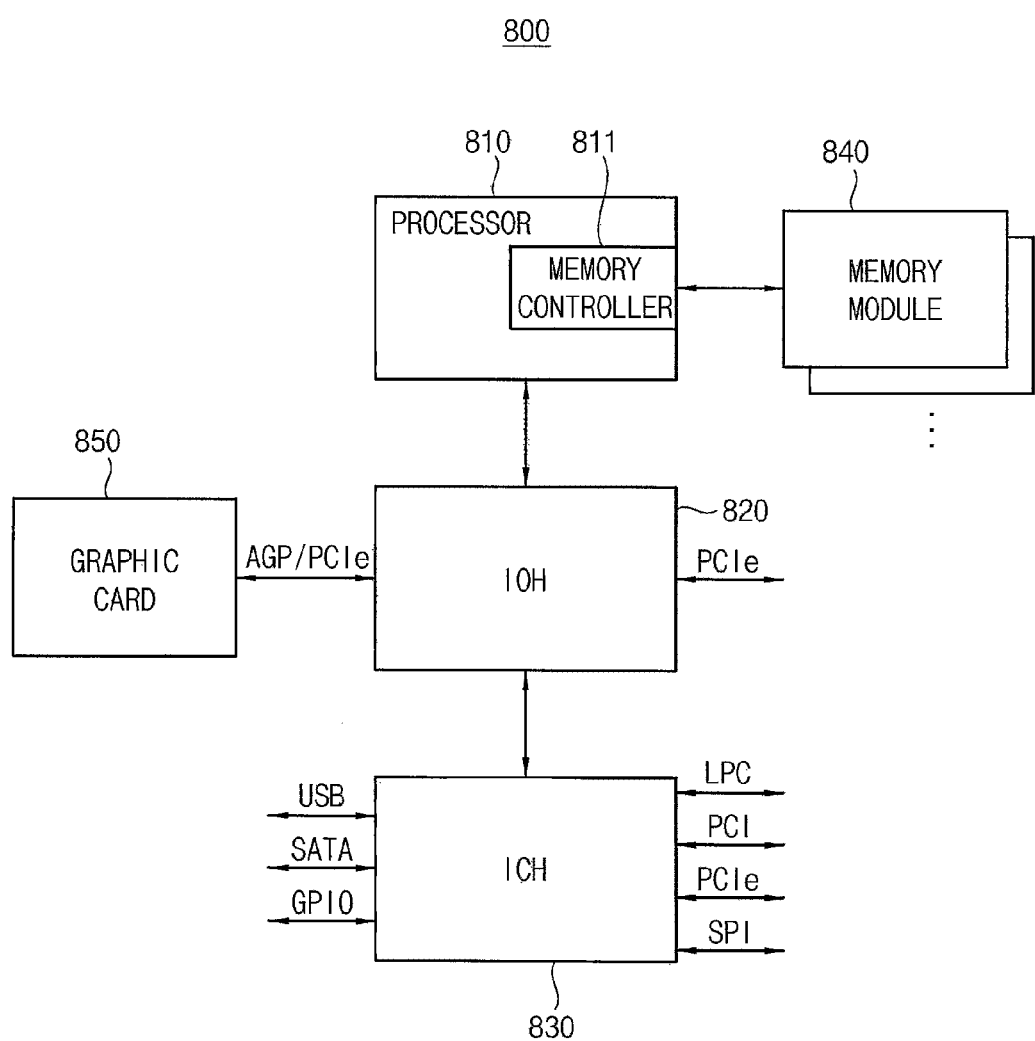
FIG. 41 is a block diagram illustrating an example of an interface used in the computing system of FIG. 40 according to example embodiments.

FIG. 41 is a block diagram illustrating an example of an interface used in the computing system of FIG. 40 according to example embodiments.

Referring to FIG. 41, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 21 illustrates the computing system 800 including one processor 810, in some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The memory module 840 may include a plurality of memory devices disclosed herein that store data provided from the memory controller 811 and a buffer chip that manages overall operation of the memory devices. Each of the memory devices may store data processed by the CPU 710, or may operate as a working memory. Each of the memory devices may be a dynamic random access memory, such as DDR SDRAM, LPDDR SDRAM, GDDR SDRAM, RDRAM, etc. The buffer chip manages operation of the memory devices.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. In some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not illustrated) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of inventive concepts. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An electronic device, comprising:
   a memory device comprising:
      a memory cell array comprising:
         a data region including a plurality of data memory cells coupled between a first bit line and a first source line, the data region being configured to provide a data voltage corresponding to data stored in each of the data memory cells;
         a reference region including a plurality of reference memory cells coupled between a reference bit line and a reference source line, the reference region being configured to provide a reference voltage; and
         a resistor circuit including one or more resistors, and coupled between the reference source line and a power source line; and
      a sense amplifier configured to provide an output voltage by comparing the data voltage and the reference voltage,
      wherein the first power source line is either a ground voltage or a negative voltage.

2. The electronic device of claim 1, wherein each memory cell of the data memory cells and the reference memory cells includes a magnetic tunnel junction (MTJ) element and a transistor connected to each other.

3. The electronic device of claim 2, wherein a state of each cell of the reference memory cells is a first state in which a spin direction of a first layer included in the MTJ of the cell is equal to a spin direction of a second layer included in the MTJ of the cell, or
   wherein a state of each cell of the reference memory cells is a second state in which a spin direction of a first layer included in the MTJ of the cell is different from a spin direction of a second layer included in the MTJ of the cell.

4. The electronic device of claim 1, wherein the reference voltage is variable based on a resistance value of the resistor circuit.

5. The electronic device of claim 1, wherein the reference region includes a reference transistor connecting between the reference source line and the resistor circuit, and
   wherein the data region includes a data transistor connecting between the first source line and the ground voltage.

6. The electronic device of claim 5, wherein the reference transistor and the data transistor are configured to turn on when the memory device is in a read operation, and to turn off when the memory device is in a write operation.

7. The electronic device of claim 1, wherein a resistance value of the resistor circuit is changeable based on one or more control signals.

8. The electronic device of claim 1, wherein the memory cell array is a three-dimensional memory cell array.

9. The electronic device of claim 1, further comprising:
   a memory controller configured to provide an address signal and a command signal to the memory device.

10. A memory device, comprising:
    a first memory cell coupled between a first bit line and a first source line;
    a first transistor coupled between the first source line and a first power source line;
    a second memory cell coupled between a second bit line and a second source line;
    a second transistor coupled between the second source line and a second power source line;
    a resistor circuit including one or more resistors coupled between the second transistor and the second power source line; and
    a sense amplifier configured to sense and amplify a voltage difference between a voltage level of the first bit line and a voltage level of the second bit line,
    wherein the voltage level of the second bit line is variable based on a resistance value of the resistor circuit.

11. The memory device of claim 10, wherein the first power source line is a ground voltage and the second power source line is either the ground voltage or a negative voltage.

12. The memory device of claim 10, wherein the first memory cell includes a first magnetic tunnel junction element and a first cell transistor connected to each other, and a first end of the first cell transistor is connected to the first source line, and
    wherein the second memory cell includes a second magnetic tunnel junction element and a second cell transistor connected to each other, and a first end of the second cell transistor is connected to the second source line.

13. The memory device of claim 10, wherein the memory device is configured to store either a first state or a second state opposite to the first state in the first memory cell,
    wherein the memory device is configured to store the first state in the second memory cell, and
    wherein the first state stored in the first and second memory cells corresponds to a low resistance value and the second state stored in the second memory cell corresponds to a high resistance value.

14. The memory device of claim 10, wherein a resistance value of the resistor circuit is changeable based on one or more control signals.

15. The memory device of claim 10, wherein the memory device is configured to turn on the first and second transistors when the memory device is in a read operation, and
    wherein the memory device is configured to turn off the first and second transistors when the memory device is in a write operation.

16. A memory device, comprising:
    a first set of memory cells coupled between a first bit line and a first source line, wherein each cell of the first set of memory cells includes a first magnetic tunnel junction element and a first cell transistor connected to each other;
    a second set of memory cells coupled between a second bit line and a second source line, wherein each cell of the second set of memory cells includes a second magnetic tunnel junction element and a second cell transistor connected to each other;
    a resistor circuit including one or more resistors, and coupled between the second source line and a power source line; and
    a sense amplifier configured to provide an output voltage based on a voltage level of the first bit line and a voltage level of the second bit line,
    wherein the voltage level of the second bit line is variable based on the resistance value of the resistor circuit.

17. The memory device of claim 16, wherein the power source line is either a ground voltage or a negative voltage.

18. The memory device of claim 17, further comprising:
a data transistor coupled between the first source line and the ground voltage; and
a reference transistor coupled between the second source line and the power source line,
wherein the memory device is configured to turn on or turn off the data transistor and the reference transistor based on a control signal, and
wherein the memory device is configured to turn on the data and reference transistors when the memory device is in a read operation and to turn off when the memory device is in a write operation.

19. The memory device of claim 16, wherein the memory device is configured to store either a first state or a second state opposite to the first state in each cell of the first set of memory cells,
wherein the memory device is configured to store the first state in each cell of the second set of memory cells, and
wherein the first state corresponds to a low resistance value and the second state corresponds to a high resistance value.

20. The memory device of claim 16, wherein a resistance value of the resistor circuit is changeable based on one or more control signals.

* * * * *